US012588552B2

(12) United States Patent
Maruyama et al.

(10) Patent No.: US 12,588,552 B2
(45) Date of Patent: Mar. 24, 2026

(54) MULTI-CHIP SEMICONDUCTOR SWITCHING DEVICE

(71) Applicant: FUJI ELECTRIC CO., LTD.,
Kawasaki (JP)

(72) Inventors: Rikihiro Maruyama, Matsumoto (JP);
Norihiro Komiyama, Matsumoto (JP);
Kunio Kobayashi, Azumino (JP); **Yuto
Kobayashi, Matsumoto (JP); Takahito
Harada, Matsumoto (JP); Hirohisa
Oyama, Matsumoto (JP); Masahiro
Sasaki, Azumino (JP); Ryousuke Usui**,
Matsumoto (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 809 days.

(21) Appl. No.: 17/828,934

(22) Filed: May 31, 2022

(65) Prior Publication Data

US 2023/0014848 A1 Jan. 19, 2023

(30) Foreign Application Priority Data

Jul. 15, 2021 (JP) ................................. 2021-116826

(51) Int. Cl.
*H01L 25/16* (2023.01)
*H01L 23/00* (2006.01)
(Continued)

(52) U.S. Cl.
CPC ............ *H01L 25/162* (2013.01); *H01L 24/48*
(2013.01); *H05K 1/111* (2013.01); *H05K
1/181* (2013.01);
(Continued)

(58) Field of Classification Search
CPC .. H10D 80/213; H10D 80/251; H01L 25/162;
H05K 2201/0784; H05K 2201/0792
See application file for complete search history.

(56) References Cited

U.S. PATENT DOCUMENTS 4,766,481 A * 8/1988 Gobrecht ............ H01L 23/5383
257/664
5,767,579 A * 6/1998 Kanazawa .............. H01L 25/16
257/691

(Continued)

FOREIGN PATENT DOCUMENTS

JP H08191239 A 7/1996
JP 2001015672 A 1/2001
(Continued)

OTHER PUBLICATIONS

Japanese Office Action issued on Mar. 25, 2025, for corresponding
Japanese Patent Application No. 2021-116826.

*Primary Examiner* — Eliseo Ramos Feliciano
*Assistant Examiner* — Brad A Knudson
(74) *Attorney, Agent, or Firm* — Rabin & Berdo, P.C

(57) ABSTRACT

A semiconductor device includes first semiconductor chips
that each include a first control electrode and a first output
electrode, second semiconductor chips each include a sec-
ond control electrode and a second output electrode, first and
second input circuit patterns on which the first and second
input electrodes are disposed, respectively, first and second
control circuit patterns electrically connected to the first and
second control electrodes, respectively, first and second
resistive elements, and a first inter-board wiring member.
The first control electrodes and first resistive element are
electrically connected via the first control circuit pattern, the
second control electrodes and second resistive element are
electrically connected via the second control circuit pattern,
and at least one of the first output electrodes and at least one (Continued)

of the second output electrodes are electrically connected to each other via the first inter-board wiring member.

13 Claims, 10 Drawing Sheets

(51) Int. Cl.

| | |
|---|---|
| *H05K 1/11* | (2006.01) |
| *H05K 1/18* | (2006.01) |
| *H05K 1/181* | (2026.01) |
| *H10D 80/20* | (2025.01) |
| *H01L 23/373* | (2006.01) |

(52) U.S. Cl.

CPC ......... *H10D 80/213* (2025.01); *H10D 80/251* (2025.01); *H01L 23/3735* (2013.01); *H01L 2224/48137* (2013.01); *H01L 2224/48227* (2013.01); *H01L 2924/10253* (2013.01); *H01L 2924/10272* (2013.01); *H01L 2924/1033* (2013.01); *H01L 2924/12031* (2013.01); *H01L 2924/12032* (2013.01); *H01L 2924/1207* (2013.01); *H01L 2924/13055* (2013.01); *H01L 2924/13091* (2013.01); *H01L 2924/15787* (2013.01); *H05K 2201/0784* (2013.01); *H05K 2201/0792* (2013.01)

(56) References Cited

U.S. PATENT DOCUMENTS

| | | | |
|---|---|---|---|
| 2011/0310568 A1 * | 12/2011 | Hong | .................... H01L 25/072 257/E29.325 |
| 2017/0077044 A1 | 3/2017 | Soyano | |
| 2020/0185359 A1 * | 6/2020 | Nakashima | ........... H02M 1/088 |
| 2020/0395344 A1 | 12/2020 | Horie et al. | |

FOREIGN PATENT DOCUMENTS

| | | | | | |
|---|---|---|---|---|---|
| JP | 2001185679 A | * | 7/2001 | ....... | H01L 2224/451 |
| JP | 2013138234 A | | 7/2013 | | |
| JP | 2013239697 A | * | 11/2013 | ............. | H01L 24/49 |
| JP | 2017011081 A | * | 1/2017 | ... | H01L 2224/48137 |
| JP | 2018078406 A | | 5/2018 | | |
| JP | 2018101734 A | | 6/2018 | | |
| WO | 2016084622 A1 | | 6/2016 | | |
| WO | WO-2020054806 A1 | * | 3/2020 | ........ | H01L 23/49811 |

* cited by examiner

MULTI-CHIP SEMICONDUCTOR SWITCHING DEVICE

CROSS-REFERENCE TO RELATED APPLICATION

This application is based upon and claims the benefit of priority of the prior Japanese Patent Application No. 2021-116826, filed on Jul. 15, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power conversion devices. Power devices are switching elements. Examples of these switching elements include insulated gate bipolar transistors (IGBTs) and power metal-oxide-semiconductor field-effect transistors (MOS-FETs). A semiconductor device includes semiconductor chips including power devices and insulated circuit boards. The individual insulated circuit board includes an insulating plate and circuit patterns which are formed on the front surface of the insulating plate and on which semiconductor chips are bonded. In addition, on the insulated circuit boards, desired circuits are formed by electrically connecting an individual semiconductor chip and an individual circuit pattern and a plurality of circuit patterns via bonding wires. In addition, external connection terminals (lead frames) are electrically connected to the circuit patterns. These semiconductor chips, insulated circuit boards, and bonding wires and part of the external connection terminals are stored in a case, and the case is filled with sealing material (for example, see International Publication Pamphlet No. WO 2016/084622 A1).

A semiconductor chip including a switching element included in the above semiconductor device could exhibit an oscillation phenomenon. In particular, when the switching element is made of wide bandgap semiconductor as its main component, the semiconductor chip could easily exhibit an oscillation phenomenon more prominently. Occurrence of such an oscillation phenomenon deteriorates the reliability of the semiconductor device.

SUMMARY OF THE INVENTION

In one aspect of the embodiments, there is provided a semiconductor device, including: a plurality of first semiconductor chips, each of which includes a first control electrode and a first output electrode on a front surface thereof and a first input electrode on a rear surface thereof; a plurality of second semiconductor chips, each of which includes a second control electrode and a second output electrode on a front surface thereof and a second input electrode on a rear surface thereof; a first input circuit pattern on which the first input electrodes of the plurality of first semiconductor chips are disposed; a first control circuit pattern electrically connected to the first control electrodes; a second input circuit pattern on which the second input electrodes of the plurality of second semiconductor chips are disposed; a second control circuit pattern electrically connected to the second control electrodes; a first resistive element, the first control electrodes and the first resistive element being electrically connected via the first control circuit pattern; a second resistive element, the second control electrodes and the second resistive element being electrically connected via the second control circuit pattern; and a first inter-board wiring member, at least one of the first output electrodes and at least one of the second output electrodes being electrically connected to each other via the first inter-board wiring member.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
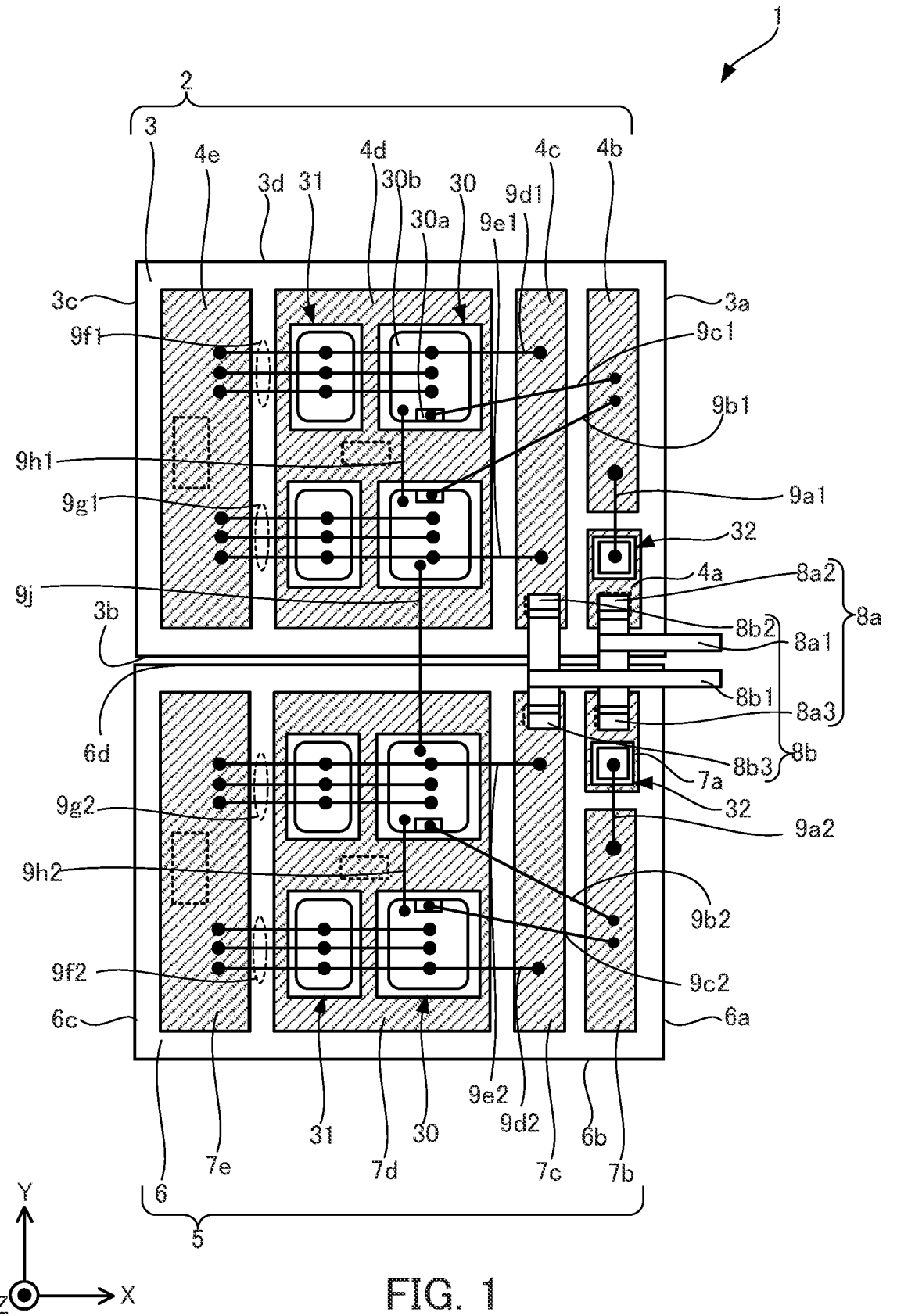
FIG. 1 is a plan view of a semiconductor device according to a first embodiment.

Hereinafter, embodiments will be described with reference to the accompanying drawings. In the following description, regarding a semiconductor device in a drawing, terms "front surface" and "top surface" each mean an X-Y plane facing upward (+Z direction). Likewise, regarding the semiconductor device in the drawing, a term "up" means an upward direction (+Z direction). In addition, regarding the semiconductor device in the drawing, terms "rear surface" and "bottom surface" each mean an X-Y plane facing downward (−Z direction). Likewise, regarding the semiconductor device in the drawing, a term "down" means a downward direction (−Z direction). In the other drawings, too, the above terms mean their respective directions, as needed. The terms "front surface", "top surface", "up", "rear surface", "bottom surface", "down", and "side surface" are only expressions used for the purpose of convenience to determine relative positional relationships and do not limit the technical concept of the embodiments. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component will be referred to as the "main component" of the material.

First Embodiment

Figure 2B:
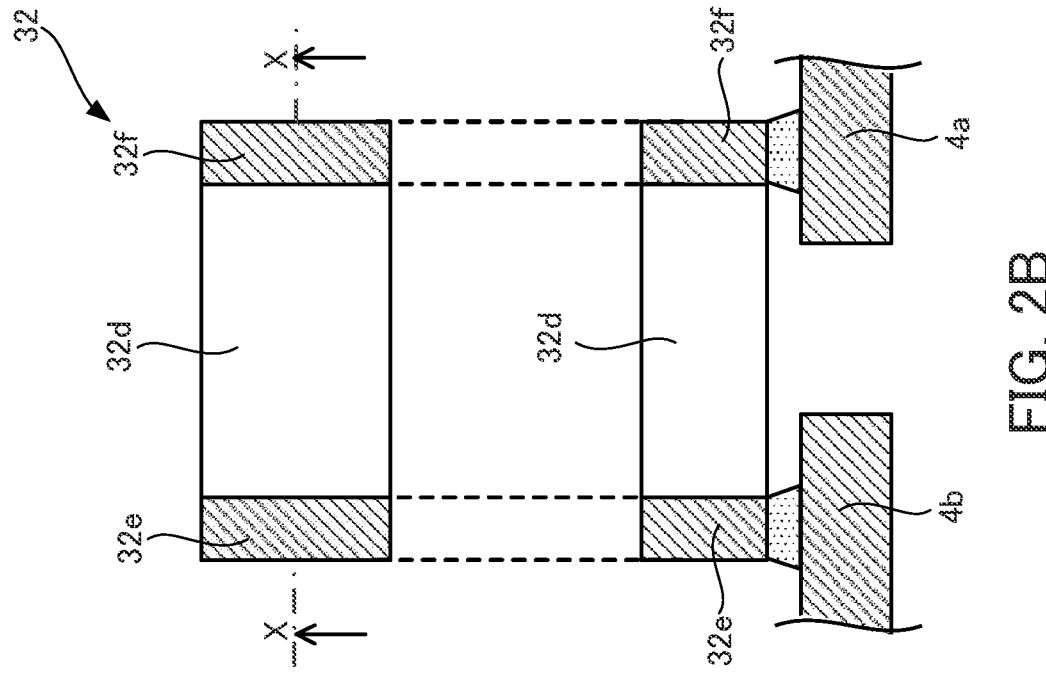
FIGS. 2A and 2B each illustrate a resistor chip included in the semiconductor device according to the first embodiment.
Figure 2A:
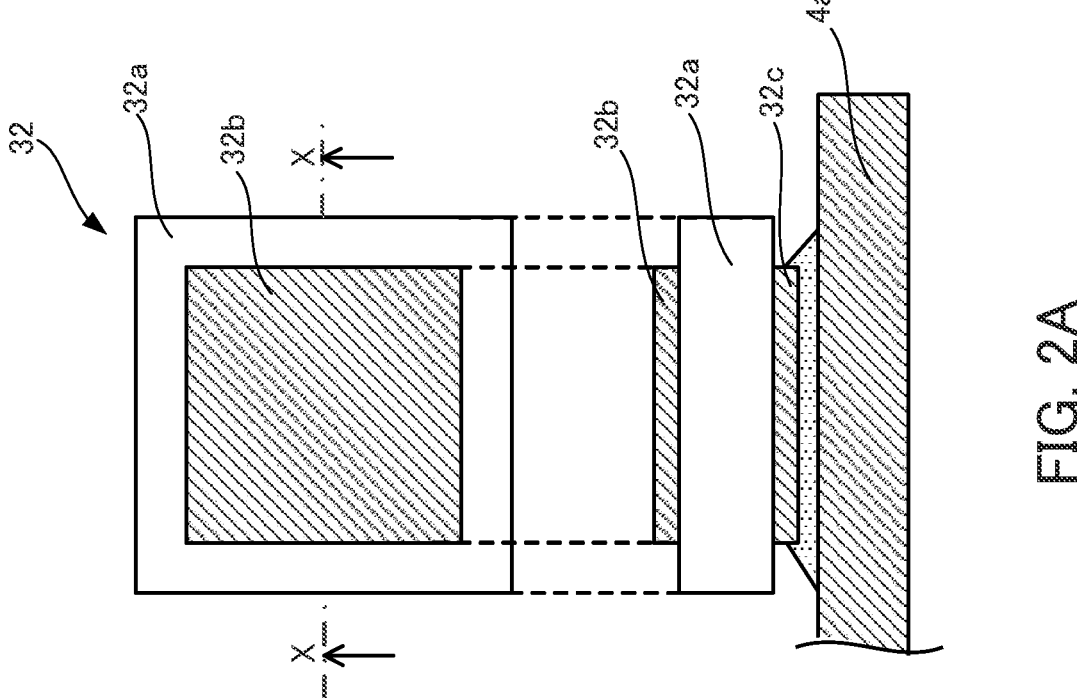

A semiconductor device according to a first embodiment will be described with reference to FIG. 1 and FIGS. 2A and 2B. FIG. 1 is a plan view of the semiconductor device according to the first embodiment. FIGS. 2A and 2B each illustrate a resistor chip included in the semiconductor device according to the first embodiment. FIG. 2A illustrates a vertical-type resistor chip, and FIG. 2B illustrates a horizontal-type resistor chip. In each of FIGS. 2A and 2B, the upper part is a plan view of the corresponding resistor chip, and the lower part is a sectional view taken along a dashed-dotted line X-X in the corresponding upper part. This semiconductor device 1 includes insulated circuit boards (first and second insulated circuit boards) 2 and 5, a lead frame 8a (a control terminal), a lead frame 8b, semiconductor chips 30 and 31, and resistor chips 32. The semiconductor device 1 constitutes a single arm in this way. Thus, in addition to this structure as an upper arm, the semiconductor device 1 may also include a lower arm having the same structure as that of the upper arm. In addition, the insulated circuit boards 2 and 5, the semiconductor chips 30 and 31, and the resistor chips (a first resistive element and a second resistive element) 32 are electrically connected as appropriate via wires.

The insulated circuit boards 2 and 5 of the semiconductor device 1 are disposed side by side. That is, as will be described below, a first side 3a and a fifth side 6a of insulating plates (first and second insulating plates) 3 and 6 of the insulated circuit boards 2 and 5 form the same plane, and a third side 3c and a seventh side 6c of the insulating plates 3 and 6 of the insulated circuit boards 2 and 5 form the same plane. In addition, a second side 3b of the insulating plate 3 and an eighth side 6d of the insulating plate 6 face each other. The insulated circuit boards 2 and 5 of the semiconductor device 1 may be disposed on a metal base board via solder. In addition, the insulated circuit boards 2 and 5 on the base board of the semiconductor device 1 may be stored in a case, and the rear surface of the base board of the semiconductor device 1 may be exposed to the outside. The inside of the case may be filled with sealing material. Alternatively, the insulated circuit boards 2 and 5 on the base board of the semiconductor device 1 may be filled with sealing material without using a case, and the rear surface of the base board may be exposed to the outside.

As illustrated in FIG. 1, the insulated circuit boards 2 and 5 are structured to be symmetrical with respect to the second side 3b and the eighth side 6d. These insulated circuit boards 2 and 5 include the insulating plates 3 and 6, circuit patterns 4a to 4e and 7a to 7e formed on the front surfaces of the insulating plates 3 and 6, metal plates (not illustrated) formed on the rear surfaces of the insulating plates 3 and 6. The insulating plates 3 and 6 and the metal plates each have a rectangular shape in plan view. In particular, the insulating plate 3 has the first side 3a, the second side 3b, the third side 3c, and a fourth side 3d sequentially, and the insulating plate 6 has the fifth side 6a, a sixth side 6b, the seventh side 6c, and the eighth side 6d sequentially. Corners of the insulating plates 3 and 6 and the metal plates may be R- or C-chamfered. Each of the metal plates is smaller than the corresponding one of the insulating plates 3 and 6 and is formed inside the corresponding one of the insulating plates 3 and 6 in plan view.

The insulating plates 3 and 6 are each made of ceramic material having a high thermal conductivity as its main component. The ceramic material is, for example, material containing aluminum oxide, aluminum nitride, or silicon nitride as its main component. The insulating plates 3 and 6 each have a thickness between 0.2 mm and 2.5 mm, inclusive.

The metal plates are each made of metal material having an excellent thermal conductivity as its main component. The metal material is, for example, copper, aluminum, or an alloy containing at least one of these kinds. In addition, the metal plates each have a thickness between 0.1 mm and 5.0 mm, inclusive. The surface of the individual metal plate may be plated to improve its corrosion resistance. The material used for this plating is, for example, nickel, a nickel-phosphorus alloy, or a nickel-boron alloy.

The circuit patterns 4a to 4e and 7a to 7e each have a rectangular shape of a different size in plan view. Each of these circuit patterns 4a to 4e and 7a to 7e is made of metal material having an excellent electrical conductivity as its main component. The metal material is, for example, copper, aluminum, or an alloy containing at least one of these kinds. The circuit patterns 4a to 4e and 7a to 7e each have a thickness between 0.1 mm and 5.0 mm, inclusive. The surface of each of the circuit patterns 4a to 4e and 7a to 7e may be plated to improve its corrosion resistance. The material used for this plating is, for example, nickel, a nickel-phosphorus alloy, or a nickel-boron alloy. The circuit patterns 4a to 4e and 7a to 7e are obtained by forming metal layers on the front surfaces of the insulating plates 3 and 6 and performing, for example, etching on the metal layers. Alternatively, the circuit patterns 4a to 4e and 7a to 7e that have previously been cut out of metal layers may be attached to the front surfaces of the insulating plates 3 and 6 by applying pressure. The shapes of and the number of circuit patterns 4a to 4e and 7a to 7e illustrated in FIG. 1 are examples. In addition, areas surrounded by dashed lines in the circuit patterns 4d, 7d, 4e, and 7e represent portions to which lead frames (external connection terminals) are bonded.

The circuit pattern (first resistive circuit pattern) 4a is formed near the first side 3a on the front surface of the insulating plate 3 and along the second side 3b. The circuit pattern (first control circuit pattern) 4b is formed near the first side 3a on the front surface of the insulating plate 3 and closer to the fourth side 3d than the circuit pattern 4a. That is, the circuit patterns 4a and 4b are aligned along the first side 3a.

The circuit pattern (second resistive circuit pattern) 7a is formed near the fifth side 6a on the front surface of the insulating plate 6 and along the eighth side 6d. The circuit pattern 7a faces the circuit pattern 4a. The circuit pattern (second control circuit pattern) 7b is formed near the fifth side 6a on the front surface of the insulating plate 6 and closer to the sixth side 6b than the circuit pattern 7a. That is, the circuit patterns 7a and 7b are aligned along the fifth side 6a.

The circuit pattern 4c is formed adjacent to the circuit patterns 4a and 4b in the direction of the third side 3c and extends between the second side 3b and the fourth side 3d. The circuit pattern 7c is formed adjacent to the circuit patterns 7a and 7b in the direction of the seventh side 6c and extends between the sixth side 6b and the eighth side 6d. The circuit pattern (first input circuit pattern) 4d is formed adjacent to the circuit pattern 4c in the direction of the third side 3c and extends between the second side 3b and the fourth side 3d. The circuit pattern (second input circuit pattern) 7d is formed adjacent to the circuit pattern 7c in the direction of the seventh side 6c and extends between the sixth side 6b and the eighth side 6d. The circuit pattern 4e is formed adjacent to the circuit pattern 4d in the direction of the third side 3c and extends along the third side 3c between the second side 3b and the fourth side 3d. The circuit pattern 7e is formed adjacent to the circuit pattern 7d in the direction of the seventh side 6c and extends along the seventh side 6c between the sixth side 6b and the eighth side 6d.

For example, direct copper bonding (DCB) boards or active metal brazed (AMB) boards may be used as the insulated circuit boards 2 and 5 having the above structure. The insulated circuit boards 2 and 5 transfer the heat generated by the semiconductor chips 30 and 31 to the outside via the circuit patterns 4d and 7d, the insulating plates 3 and 6, and the metal plates.

Each of the semiconductor chips 30 and 31 is made of silicon as its main component. Alternatively, the semiconductor chips 30 and 31 may each be made of wide bandgap semiconductor as its main component. The wide bandgap semiconductor is, for example, silicon carbide or gallium nitride. The semiconductor chips 30 are switching elements. The switching elements are, for example, IGBTs or power MOSFETs. Each of the semiconductor chips 30 includes a drain electrode or a collector electrode as its input electrode (a main electrode) on its rear surface. In addition, each of the semiconductor chips 30 includes a control electrode 30a (a gate electrode) and an output electrode 30b (a source electrode or an emitter electrode) as a main electrode on its front surface. A plurality of portions (for example, two portions) on the rear surface of the individual semiconductor chip 30 are bonded on the circuit pattern 4d or 7d along the first side 3a or the fifth side 6a and the third side 3c or the seventh side 6c via bonding material (not illustrated). In FIG. 1, the two semiconductor chips 30 are formed on the circuit pattern 4d in such a manner that the corresponding control electrodes 30a face each other. Likewise, the two semiconductor chips 30 are formed on the circuit pattern 7d in such a manner that the corresponding control electrodes 30a face each other. Alternatively, the semiconductor chips 30 on the circuit pattern 4d may be formed in such a manner that the corresponding control electrodes 30a face the first side 3a. Likewise, the semiconductor chips 30 on the circuit pattern 7d may be formed in such a manner that the corresponding control electrodes 30a face the fifth side 6a. Alternatively, the semiconductor chips 30 on the circuit pattern 4d may be formed in such a manner that the corresponding control electrodes 30a face the second side 3b and the fourth side 3d of the insulating plate 3. Likewise, the semiconductor chips 30 on the circuit pattern 7d may be formed in such a manner that the corresponding control electrodes 30a face the sixth side 6b and the eighth side 6d of the insulating plate 6.

The bonding material is solder or metal sintered material. As the solder, lead-free solder is used. The main component of the lead-free solder is, for example, an alloy containing at least two of tin, silver, copper, zinc, antimony, indium, and bismuth. The solder may contain additive. The metal sintered material contains silver or a silver alloy as its main component. The bonding material may also be used for bonding the semiconductor chips 31 to the circuit patterns 4d and 7d, as will be described below.

The semiconductor chips 31 include diode elements. The diode elements are, for example, freewheeling diodes (FWDs) such as Schottky barrier diodes (SBDs) or P-intrinsic-N (PiN) diodes. The individual semiconductor chip 31 includes a cathode electrode as a rear surface negative electrode on its rear surface and includes an anode electrode as a front surface positive electrode on its front surface. A plurality of portions (for example, two portions) on the rear surface of the individual semiconductor chip 31 are bonded on the circuit pattern 4d or 7d in parallel to the first side 3a or the fifth side 6a and the third side 3c or the seventh side 6c and along a semiconductor chip 30 via bonding material (not illustrated). Reverse-conducting (RC)-IGBT elements may be disposed in place of these semiconductor chips 30 and 31. An RC-IGBT element is a single semiconductor chip formed by a switching element and a diode element.

The individual resistor chip 32 is bonded to the inside of the circuit pattern 4a or 7a via the above bonding material. The lower part (sectional view) of FIG. 2A illustrates the resistor chip 32 being bonded to the circuit pattern 4a. Each of the resistor chips 32 used herein is a vertical-type resistor chip as illustrated in FIG. 2A and has a rectangular shape in plan view. The individual resistor chip 32 includes a resistive part 32a, a front surface electrode 32b formed on the front surface of the resistive part 32a, and a rear surface electrode 32c formed on the rear surface of the resistive part 32a. The resistive part 32a contains resistive material that connects the front surface electrode 32b and the rear surface electrode 32c, which will be described below. The resistive part 32a has a thickness between 0.1 mm and 5.0 mm, inclusive. The length of one side of the resistive part 32a in plan view is between 0.1 mm and 10.0 mm, inclusive. In addition, the front surface electrode 32b and the rear surface electrode 32c are each made of metal material having an excellent electrical conductivity as its main component. Examples of the metal material include copper, aluminum, and an alloy containing at least one of these kinds. The front surface electrode 32b and the rear surface electrode 32c each have a thickness between 0.1 mm and 5.0 mm, inclusive. The front surface electrode 32b and the rear surface electrode 32c each have a size smaller than that of the resistive part 32a and are formed inside the resistive part 32a in plan view.

FIG. 2B illustrates a horizontal-type resistor chip 32. The lower part (sectional view) of FIG. 2B illustrates the resistor chip 32 being bonded to the circuit patterns 4a and 4b. The horizontal-type resistor chip 32 includes a cuboid resistive part 32d and electrodes (first and second electrodes) 32e and 32f on two sides thereof. The resistive part 32d includes cuboid ceramic material, a resistive film formed on the front surface of the ceramic material, and a protective film formed on the resistive film. The electrodes 32e and 32f cover the two sides of the ceramic material and are connected to the resistive film. A case in which these horizontal-type resistor chips 32 are used will be described below.

The lead frame 8a has one end that is electrically connected to an external control device or the like and has the other end connected to the insulated circuit boards 2 and 5. The lead frame 8a may be a control terminal. The lead frame 8a includes a wiring part 8a1 and leg parts 8a2 and 8a3 bonded to the wiring part 8a1. The wiring part 8a1 is a linear part, for example. In addition, one end (on the right side in FIG. 1) of the wiring part 8a1 may include a control terminal that is electrically connected to an external control device. The other end (on the left side in FIG. 1) of the wiring part 8a1 is connected to the leg parts 8a2 and 8a3. The leg part 8a2 is bonded to a part of the circuit pattern 4a, the part being near the second side 3b. The leg part 8a3 is bonded to a part of the circuit pattern 7a, the part being near the eighth side 6*d*. The above-described bonding material may be used for bonding the leg parts 8*a*2 and 8*a*3 to the circuit patterns 4*a* and 7*a*, respectively. This bonding may be achieved by ultrasonic bonding. The lead frame 8*a* is made of metal material having an excellent electrical conductivity as its main component. Examples of the metal material include copper, aluminum, and an alloy containing at least one of these kinds. The surface of the lead frame 8*a* may be plated to improve its corrosion resistance. Examples of the material used for this plating include nickel, a nickel-phosphorus alloy, and a nickel-boron alloy. Thus, when a control voltage is applied to one end of the wiring part 8*al* of the lead frame 8*a*, a current flows through the wiring part 8*al* and is divided into two currents flowing through the leg parts 8*a*2 and 8*a*3. The currents consequently flow through the circuit patterns 4*a* and 7*a*. The present embodiment is not limited to this case. A control terminal may be prepared separately from the lead frame 8*a*. For example, a separate control terminal may be electrically connected to one end (on the right side in FIG. 1) of the wiring part 8*a*1. That is, when a control voltage is applied by an external control device, a current may flow through each of the circuit patterns 4*a* and 7*a* via the control terminal and the lead frame 8*a* or via the lead frame 8*a* including the control terminal.

The lead frame 8*b* has one end that is electrically connected to an external control device or the like and has the other end connected to the insulated circuit boards 2 and 5. The lead frame 8*b* may be a sense terminal. The lead frame 8*b* includes a wiring part 8*bl* and leg parts 8*b*2 and 8*b*3 bonded to the wiring part 8*b*1. The wiring part 8*bl* is a linear part, for example. In addition, one end (on the right side in FIG. 1) of the wiring part 8*bl* may include a control terminal that is electrically connected to the external control device. The other end (on the left side in FIG. 1) of the wiring part 8*bl* is connected to the leg parts 8*b*2 and 8*b*3. The leg part 8*b*2 is bonded to a part of the circuit pattern 4*c*, the part being near the second side 3*b*. The leg part 8*b*3 is bonded to a part of the circuit pattern 7*c*, the part being near the eighth side 6*d*. The above-described bonding material may be used for bonding the leg parts 8*b*2 and 8*b*3 to the circuit patterns 4*c* and 7*c*, respectively. This bonding may be achieved by ultrasonic bonding. The lead frame 8*b* may be made of the same material as that of the lead frame 8*a*. Thus, sense current outputted from the output electrodes 30*b* (the source electrodes) of the semiconductor chips 30 on the insulated circuit boards 2 and 5 are outputted to the external control device or the like via wires 9*d*1, 9*e*1, 9*d*2, and 9*e*2, the circuit patterns 4*c* and 7*c*, the leg parts 8*b*2 and 8*b*3, and the wiring part 8*b*1. The present embodiment is not limited to this case. A sense terminal may be prepared separately from the lead frame 8*b*. For example, a separate sense terminal may be electrically connected to one end (on the right side in FIG. 1) of the wiring part 8*bl*.

Wires 9*al* to 9*h*1, wires 9*a*2 to 9*h*2, and wire (first inter-board wiring member) 9*j* are used to connect the insulated circuit boards 2 and 5, the semiconductor chips 30 and 31, and the resistor chips 32. First, control wires will be described. The wire (first relay control wiring member) 9*a*1 directly connects the front surface electrode of the corresponding resistor chip 32 and the circuit pattern 4*b*. Likewise, the wire (second relay control wiring member) 9*a*2 directly connects the front surface electrode of the corresponding resistor chip 32 and the circuit pattern 7*b*. In addition, the wires (first control wiring members) 9*b*1 and 9*c*1 directly connect the circuit pattern 4*b* and the control electrodes 30*a* of the corresponding semiconductor chips 30. Likewise, the wires (second control wiring members) 9*b*2 and 9*c*2 directly connect the circuit pattern 7*b* and the control electrodes 30*a* of the corresponding semiconductor chips 30. These control wires 9*a*1 to 9*c*1 and 9*a*2 to 9*c*2 each have a diameter, for example, between 25 μm and 400 μm, inclusive.

Next, the sense wires will be described. The sense wires 9*d*1 and 9*e*1 directly connect the output electrodes 30*b* of the corresponding semiconductor chips 30 and the circuit pattern 4*c*. Likewise, the sense wires 9*d*2 and 9*e*2 directly connect the output electrodes 30*b* of the corresponding semiconductor chips 30 and the circuit pattern 7*c*. These detection wires 9*d*1, 9*e*1, 9*d*2, and 9*e*2 each have a diameter, for example, between 25 μm and 400 μm, inclusive. These detection wires 9*d*1, 9*e*1, 9*d*2, and 9*e*2 may each have the same diameter as that of the control wires 9*al* to 9*cl* and 9*a*2 to 9*c*2.

Main current wires will be described. The wires 9*f*1 and 9*g*1 directly connect the output electrodes 30*b* of the corresponding semiconductor chips 30, the front surface positive electrodes of the corresponding semiconductor chips 31, and the circuit pattern 4*e*. Likewise, the wires 9*f*2 and 9*g*2 directly connect the output electrodes 30*b* of the corresponding semiconductor chips 30, the front surface positive electrodes of the corresponding semiconductor chips 31, and the circuit pattern 7*e*. The main current wires 9*f*1, 9*g*1, 9*f*2, and 9*g*2 each have a diameter between 100 μm and 600 μm, inclusive.

In addition, the wire (first intra-board output wiring members) 9*h*1 directly connects the output electrodes 30*b* of the semiconductor chips 30 on the insulated circuit board 2, and the wire (second intra-board output wiring members) 9*h*2 directly connects the output electrodes 30*b* of the semiconductor chips 30 on the insulated circuit board 5. In addition, the wire 9*j* extends over the insulated circuit boards 2 and 5 and directly connects the output electrode 30*b* of one semiconductor chip 30 on the insulated circuit board 2 and the output electrode 30*b* of one semiconductor chip 30 on the insulated circuit board 5. These wires 9*h*1, 9*h*2, and 9*j* each have a diameter between 25 μm and 400 μm, inclusive. These wires 9*h*1, 9*h*2, and 9*j* may each have the same diameter as that of the control wires 9*al* to 9*cl* and 9*a*2 to 9*c*2.

Figure 3:
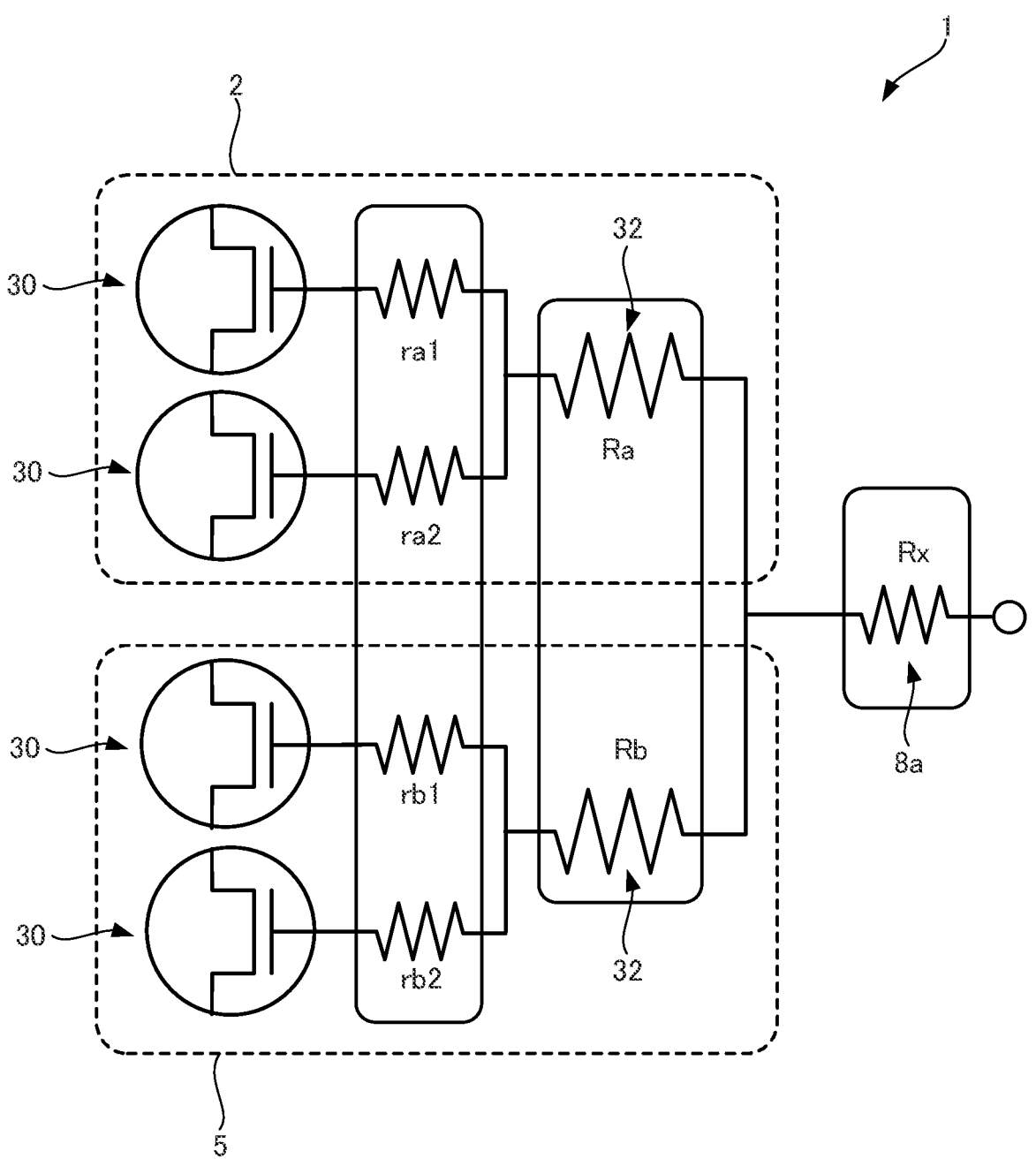
FIG. 3 illustrates a control-side wiring structure of the semiconductor device according to the first embodiment.
Figure 4:
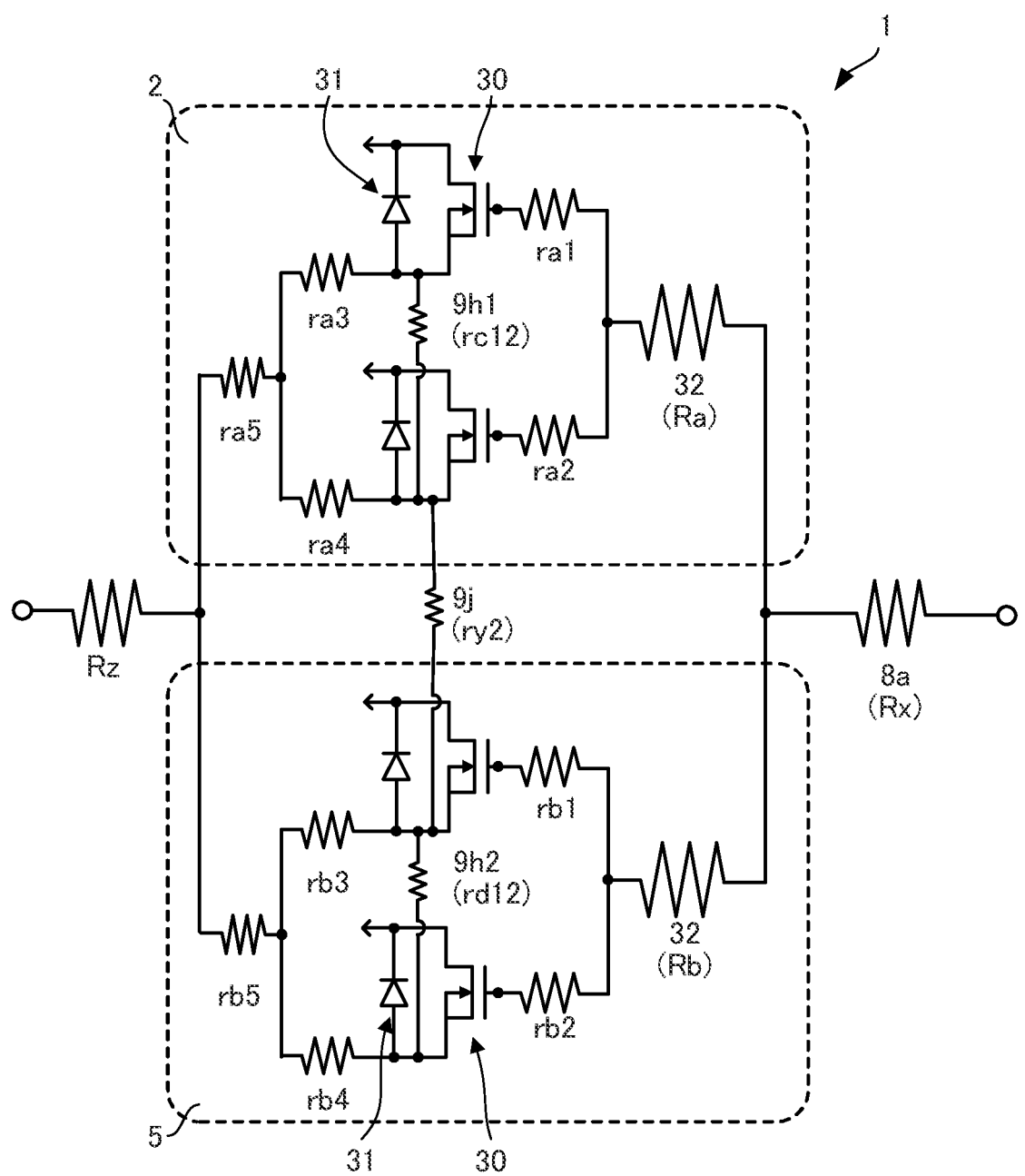
FIG. 4 illustrates an output-side wiring structure of the semiconductor device according to the first embodiment.

Next, a control-side (gate-electrode-side) wiring structure from the lead frame 8*a* (wiring part 8*a*1) of the semiconductor device 1 to the control electrodes 30*a* of the semiconductor chips 30 on the insulated circuit boards 2 and 5 and an output-side (source-electrode-side) wiring structure from the output electrodes 30*b* of the semiconductor chips 30 to an output terminal will be described with reference to FIGS. 3 and 4. FIG. 3 illustrates a control-side wiring structure of the semiconductor device according to the first embodiment, and FIG. 4 illustrates an output-side wiring structure of the semiconductor device according to the first embodiment. FIG. 4 illustrates not only the wiring structure of the output side of the semiconductor chips 30 included in the semiconductor device 1 but also the control-side wiring structure and an equivalent circuit of the semiconductor device 1 described below.

A resistor Rx in FIG. 3 represents the resistance (wiring resistance) when a current flows from the control terminal to the leg parts 8*a*2 and 8*a*3 via the wiring part 8*al* of the lead frame 8*a*. That is, the resistor Rx represents the resistance of the lead frame 8*a*. In addition, a resistor Rz in FIG. 4 represents the wiring resistance of the output terminal when a current flows. In FIG. 4, a wire from the output terminal to a circuit pattern on which the output terminal is disposed is not illustrated. A resistor Ra represents a sum of wiring resistances of the circuit pattern 4*a*, wire 9*a*1, and circuit pattern 4*b* on the insulated circuit board 2 and the resistance of the corresponding resistor chip 32. In addition, a resistor Rb is a sum of wiring resistances of the circuit pattern 7*a*, wire 9*a*2, and circuit pattern 7*b* on the insulated circuit board 5 and the resistance of the corresponding resistor chip 32. The resistance value of the individual resistor chip 32 is greater than any one of the above wiring resistances.

A resistor ra1 and a resistor ra2 represent the wiring resistances from the circuit pattern 4*b* to the control electrodes 30*a* of the semiconductor chips 30 on the insulated circuit board 2. That is, the resistor ra1 represents the wiring resistance of the wire 9*b*1. Likewise, the resistor ra2 represents the wiring resistance of the wires 9*c*1.

A resistor ra3 and a resistor ra4 represent the wiring resistances from the output electrodes 30*b* of the different semiconductor chips 30 on the insulated circuit board 2 to the circuit pattern 4*e* on the insulated circuit board 2. That is, the resistor ra3 and the resistor ra4 represent the wiring resistances of the wires 9*f*1 and 9*g*1. The resistor ra5 represents the wiring resistance from the circuit pattern 4*e* to the output terminal not illustrated.

A resistor rb1 and a resistor rb2 represent the wiring resistances when a current flows from the circuit pattern 7*b* to the control electrodes 30*a* of the semiconductor chips 30 on the insulated circuit board 5. That is, the resistor rb1 represents the wiring resistance of the wire 9*b*2, and the resistor ra2 represents the wiring resistance of the wire 9*c*2.

A resistor rb3 and a resistor rb4 represent the wiring resistances from the output electrodes 30*b* of the different semiconductor chips 30 on the insulated circuit board 5 to the circuit pattern 7*e* on the insulated circuit board 5. That is, the resistor rb3 and the resistor rb4 represent the wiring resistances of the wires 9*f*2 and 9*g*2. The resistor rb5 represents the wiring resistance from the circuit pattern 7*e* to the output terminal not illustrated.

The resistances of the resistor chips 32 on the insulated circuit boards 2 and 5 are each greater than the resistance Rx (and the resistor Rz of the output terminal) from the lead frame 8*a* to the individual resistor chip 32 and are greater than any one of the resistances ra1 to ra5 and rb1 to rb5. It is preferable that each of the resistances of the resistor chips 32 be between 10Ω and 100Ω, inclusive, more preferably, between 30Ω and 50Ω, inclusive.

First, a case in which the semiconductor device 1 does not include the resistor chips 32 will be described. In this case, for a turn-on (or turn-off) operation, a control voltage to be applied to the lead frame 8*a* is set on (or off) Depending on the difference between the paths from the control terminal, the paths have different wiring resistances and inductances. Consequently, there is caused a difference in the rise time (or fall time) among the plurality of semiconductor chips 30. As a result, the output electrodes 30*b* (the source electrodes) of the plurality of semiconductor chips 30 output their voltages at different timings. The currents are outputted to an external control device via the sense wires 9*d*1, 9*e*1, 9*d*2, and 9*e*2, the circuit patterns 4*c* and 7*c*, and the lead frame 8*b* as a disturbed voltage. Consequently, an oscillation phenomenon could occur, and the semiconductor chips 30 on the insulated circuit boards 2 and 5 could malfunction.

In contrast, the insulated circuit boards 2 and 5 of the semiconductor device 1 include the resistor chips 32. In this case, the relative difference in the wiring resistance and inductance from the control terminal (the relative ratio of the wiring resistance or inductance of an individual semiconductor chip 30 to a normal wiring resistance or inductance) is small. In this case, when a control voltage to be applied to the lead frame 8*a* is set on (or off), the difference in the rise time (or fall time) among the plurality of semiconductor chips 30 is less. Thus, since the voltages outputted by the output electrodes 30*b* (source electrodes) are not disturbed, a stable voltage is outputted to the external control device. Thus, assuming that the potentials at the output electrodes 30*b* of the semiconductor chips 30 on the different insulated circuit boards 2 and 5 are equalized, by disposing the resistor chips 32, occurrence of an oscillation phenomenon and a malfunction caused thereby is reduced.

Figure 5:
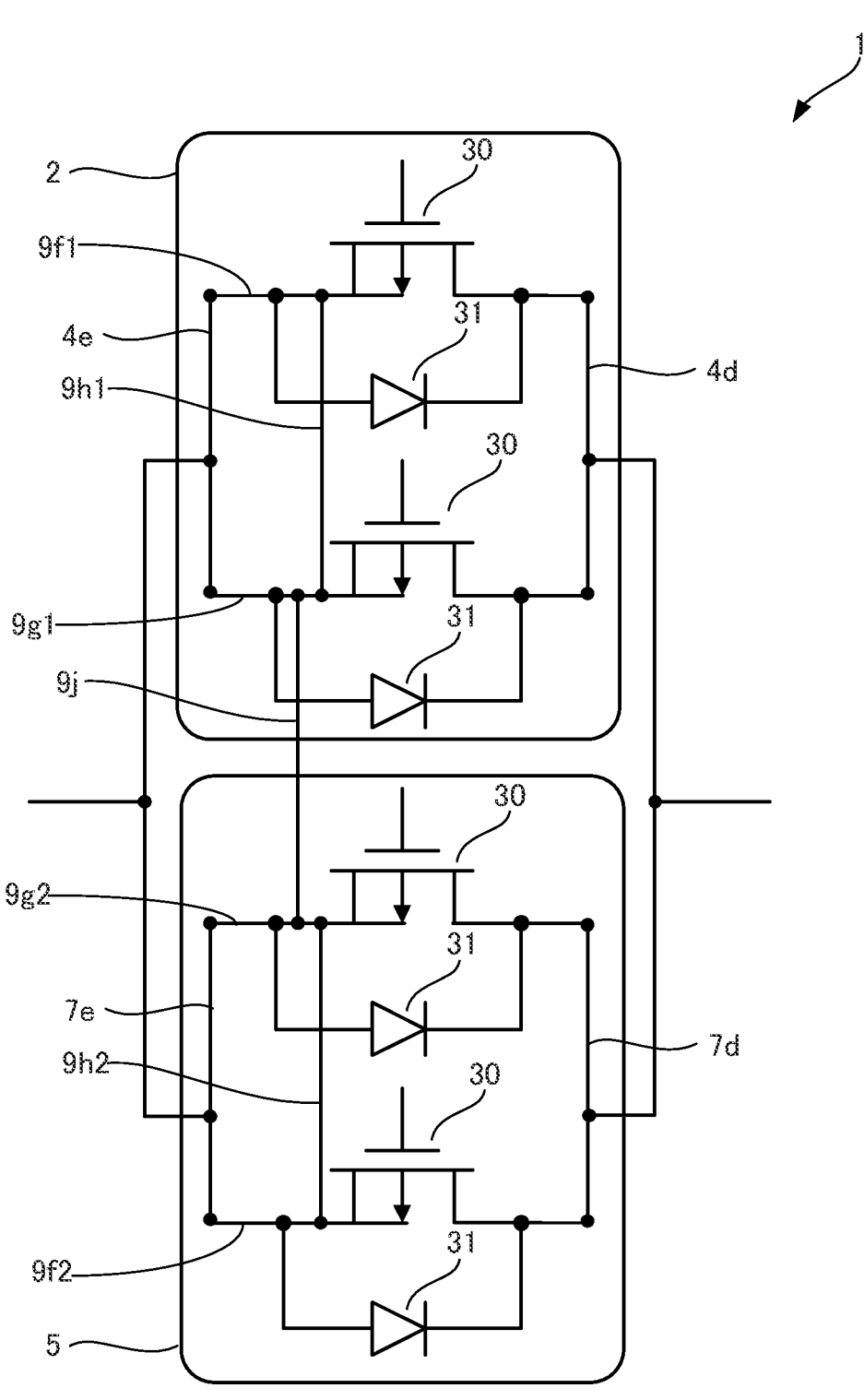
FIG. 5 illustrates an equivalent circuit of the semiconductor device according to the first embodiment.

Next, an equivalent circuit of the semiconductor device 1 will be described with reference to FIGS. 5 and 1. FIG. 5 illustrates an equivalent circuit of the semiconductor device according to the first embodiment. In FIG. 5, power MOS-FETs are illustrated as the semiconductor chips 30. The upper part in FIG. 5 corresponds to the insulated circuit board 2, and the lower part in FIG. 5 corresponds to the insulated circuit board 5.

On the circuit pattern 4*d* of the insulated circuit board 2, the rear surface input electrode (drain electrode) of the individual semiconductor chip 30 and the rear surface negative electrode of the individual semiconductor chip 31 are connected in parallel to each other. In addition, the output electrodes 30*b* (source electrodes) of the semiconductor chips 30 and the front surface positive electrodes of the semiconductor chips 31 are connected to the circuit pattern 4*e* via the wires 9*f*1 and 9*g*1. In addition, the output electrodes 30*b* of the semiconductor chips 30 are directly connected to each other via the wire 9*h*1.

On the circuit pattern 7*d* of the insulated circuit board 5, the rear surface input electrode (drain electrode) of the individual semiconductor chip 30 and the rear surface negative electrode of the individual semiconductor chip 31 are connected in parallel to each other. In addition, the front surface output electrodes (source electrodes) of the semiconductor chips 30 and the front surface positive electrodes of the semiconductor chips 31 are connected to the circuit pattern 7*e* via the wires 9*f*2 and 9*g*2. In addition, the output electrodes 30*b* of the semiconductor chips 30 are directly connected to each other via the wire 9*h*2.

In addition, in the case of the semiconductor device 1, the output electrode 30*b* of one semiconductor chip 30 on the insulated circuit board 2 and the output electrode 30*b* of one semiconductor chip 30 on the insulated circuit board 5 are directly connected to each other via the wire 9*j*.

First, a case in which the semiconductor device 1 does not include the wires 9*h*1, 9*h*2, and 9*j* will be described. In this case, the inductance value between the output electrodes 30*b* (source electrodes) of the two semiconductor chips 30 formed on the insulated circuit board 2 could become large, depending on their respective paths. Likewise, the inductance value between the output electrodes 30*b* of the two semiconductor chips 30 formed on the insulated circuit board 5 could become large, depending on their respective paths. In this case, when the semiconductor device 1 is turned on (or turned off), the potential between the control electrode 30*a* and the output electrode 30*b* (the gate electrode and the source electrode) of the individual semiconductor chip 30 could be disturbed, and an oscillation phenomenon could occur.

In particular, the semiconductor chips 30 on the insulated circuit board 2 and the semiconductor chips 30 on the insulated circuit board 5 are connected in parallel to each other. The output electrodes 30*b* of the semiconductor chips 30 on the insulated circuit board 2 and the output electrodes 30*b* of the semiconductor chips 30 on the insulated circuit board 5 are electrically connected to the lead frame 8*b* included in the semiconductor device 1 or the output terminal (not illustrated). Thus, the wiring length of the output electrode 30b of the individual semiconductor chip 30 on the insulated circuit board 2 and the output electrode 30b of the individual semiconductor chip 30 on the insulated circuit board 5 is longer than the wiring length between the output electrodes 30b of the semiconductor chips 30 disposed on the same insulated circuit board 2 (or insulated circuit board 5). Thus, the output electrodes 30b of the semiconductor chips 30 disposed on the different insulated circuit boards 2 and 5 are connected to each other via a large inductance. This could cause an oscillation phenomenon of the semiconductor chips 30.

The following description will be made on a case in which the output electrode 30b of one semiconductor chip 30 on the insulated circuit board 2 of the semiconductor device 1 is connected to the output electrode 30b of one semiconductor chip 30 on the insulated circuit board 5 via the wire 9j. By directly connecting the output electrodes 30b of the semiconductor chips 30 disposed on the different insulated circuit boards 2 and 5 via the wire 9j, the potentials of the output electrodes 30b are equalized. As a result, a stable voltage is outputted from the output electrodes 30b (source electrodes) to the external control device. Thus, as described with reference to FIG. 3, assuming that the variation in the wiring resistance and inductance among the control electrodes 30a of the semiconductor chips 30 is small, by connecting the output electrodes 30b of the semiconductor chips 30 disposed on the different insulated circuit boards 2 and 5 to each other via the wire 9j, occurrence of an oscillation phenomenon and a malfunction caused thereby is reduced.

The following description will be made on a case in which the output electrode 30b of one semiconductor chip 30 on the insulated circuit board 2 and the output electrode 30b of one semiconductor chip 30 on the insulated circuit board 5 are not connected to each other via the wire 9j while the semiconductor device 1 includes the resistor chip 32 on each of the insulated circuit boards 2 and 5. In this case, the resistor chips 32 reduce the relative difference in the wiring resistance and inductance from the control terminal among the control electrodes 30a of the semiconductor chips 30 on the insulated circuit board 2 and the control electrodes 30a of the semiconductor chips 30 on the insulated circuit board 5. However, due to a variation in the resistance values of the resistor chips 32, a relative difference in the wiring resistance and inductance from the control terminal could occur among the control electrodes 30a of the semiconductor chips 30 disposed on the different insulated circuit boards 2 and 5.

Thus, when the insulated circuit boards 2 and 5 include their respective resistor chips 32, by connecting the output electrodes 30b of the above semiconductor chips 30 disposed on the different insulated circuit boards 2 and 5 via the wire 9j, the output potentials of the different insulated circuit boards 2 and 5 are equalized. In this way, occurrence of an oscillation phenomenon and a malfunction caused thereby is reduced.

Next, a case in which the semiconductor device 1 includes the wires 9h1 and 9h2 will be described. By directly connecting the output electrodes 30b of the semiconductor chips 30 on the insulated circuit board 2 via the wire 9h1, the potentials at the output electrodes 30b are equalized, and increase of the inductance values is suppressed. In addition, likewise, by directly connecting the output electrodes 30b of the semiconductor chips 30 on the insulated circuit board 5 via the wire 9h2, the potentials at the output electrodes 30b are equalized, and occurrence of an oscillation phenomenon and a malfunction caused thereby is reduced.

As described above, by connecting the output electrodes 30b of the semiconductor device 1 via the wires 9h1, 9h2, and 9j, the inductance value between the output electrodes 30b of the semiconductor chips 30 on the insulated circuit board 2, the inductance value between the output electrodes 30b of the semiconductor chips 30 on the insulated circuit board 5, and the inductance value between the output electrodes 30b of the semiconductor chips 30 on the insulated circuit board 2 and the output electrodes 30b of the semiconductor chips 30 on the insulated circuit board 5 are reduced. As a result, an oscillation phenomenon of the semiconductor chips 30 of the semiconductor device 1 is reduced.

The above semiconductor device 1 includes the semiconductor chips 30 and the insulated circuit boards 2 and 5 on which the semiconductor chips 30 are formed. Each of the semiconductor chips 30 includes a control electrode 30a and an output electrode 30b on its front surface and an input electrode on its rear surface. The insulated circuit boards 2 and 5 include the insulating plates 3 and 6, respectively. The circuit pattern 4d (input circuit pattern) on which the input electrodes of the corresponding semiconductor chips 30 are disposed is formed on the front surface of the insulating plate 3. In addition, the circuit pattern 4b (control circuit pattern) electrically connected to the corresponding control electrodes 30a is formed on the front surface of the insulating plate 3. The circuit pattern 7d (input circuit pattern) on which the input electrodes of the corresponding semiconductor chips 30 are disposed is formed on the front surface of the insulating plate 6. The circuit pattern 7b (control circuit pattern) electrically connected to the corresponding control electrodes 30a is formed on the front surface of the insulating plate 6. With this semiconductor device 1, a control voltage is applied to the circuit patterns 4b and 7b and the control electrodes 30a via the resistor chips 32, and the output electrode 30b of a semiconductor chip 30 on the insulated circuit board 2 and the output electrode 30b of a semiconductor chip 30 on the insulated circuit board 5 are electrically connected to each other via the wire 9j (first inter-board wiring member).

The resistor chips 32 of the semiconductor device 1 reduce the relative difference in the wiring resistance and inductance from the control terminal to the control electrodes 30a. When a control voltage applied to the control electrodes 30a is turned on (or off), the difference in the rise time (or fall time) among the plurality of semiconductor chips 30 is less. As a result, the voltages at the output electrodes 30b (source electrodes) are not disturbed. Thus, a stable voltage is outputted to an external control device. In addition, the wire 9j of the semiconductor device 1 equalizes the potentials of the output electrodes 30b of the semiconductor chips 30 disposed on the different insulated circuit boards 2 and 5. In this way, a voltage is stably outputted from the output electrodes 30b (source electrodes) to the external control device. Thus, with this semiconductor device 1, occurrence of an oscillation phenomenon and a malfunction caused thereby is reduced, and deterioration of the reliability is reduced. In addition, with the semiconductor device 1, by directly connecting the output electrodes 30b of the semiconductor chips 30 on the insulated circuit board 2 via the wire 9h1 and by directly connecting the output electrodes 30b of the semiconductor chips 30 on the insulated circuit board 5 via the wire 9h2, the potentials at the output electrodes 30b are equalized, and increase in the inductance values is suppressed. Thus, occurrence of an oscillation phenomenon of the semiconductor device 1 and a malfunction caused thereby is further reduced.

Figures 6A, 6B:
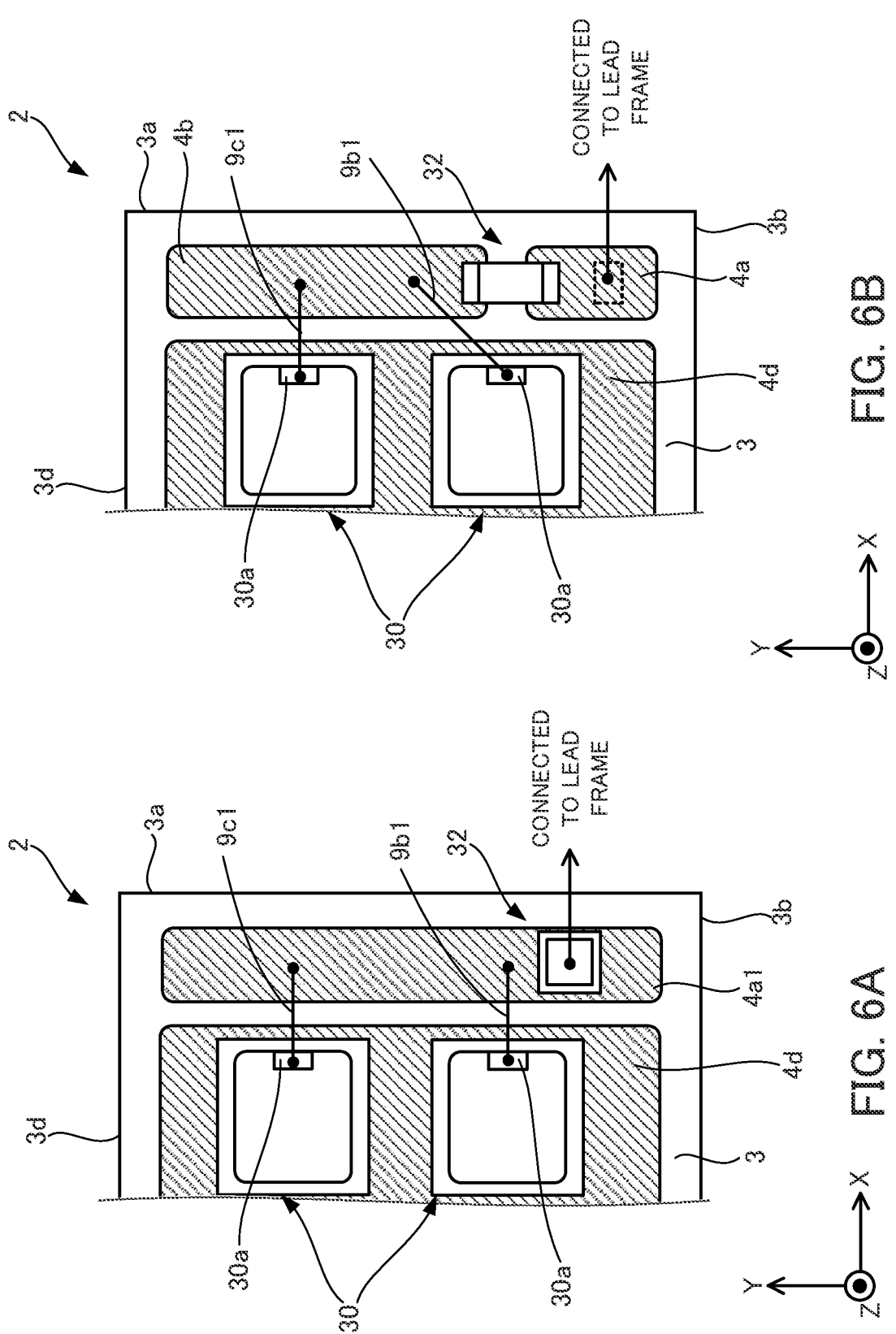
FIGS. 6A and 6B are each a plan view of a main part of a semiconductor device according to a variation of the first embodiment.

FIG. 1 illustrates only an example in which the semiconductor device 1 includes the insulated circuit boards 2 and 5. As long as the equivalent circuit illustrated in FIG. 5 is structured, the circuit patterns 4a to 4e and the circuit patterns 7a to 7e do not always need to be formed on the insulating plates 3 and 6, respectively. In addition, the arrangement of the resistor chips 32 of the semiconductor device 1 in FIG. 1 is only an example, and the present embodiment is not limited to this arrangement. In the following variations, other modes of the resistor chips 32, which contribute to reduction of occurrence of an oscillation phenomenon as in the semiconductor device 1 in FIG. 1, and other modes of the circuit patterns on which the resistor chips 32 are disposed will be described with reference to FIGS. 6A and 6B. FIGS. 6A and 6B are each a plan view of a main part of a semiconductor device according to a variation of the first embodiment. FIG. 6A illustrates an area around a resistor chip 32 according to variation 1-1. FIG. 6B illustrates an area around a resistor chip 32 according to variation 1-2.

FIGS. 6A and 6B each illustrate an area near the first side 3a of the insulated circuit board 2. FIGS. 6A and 6B each illustrate a case in which the circuit pattern 4c has been removed from the insulated circuit board 2 in FIG. 1. When the insulated circuit board 5 is disposed opposite to the insulated circuit board 2 as in FIG. 1, the circuit patterns on the insulated circuit boards 2 and 5 are structured to be symmetrical with respect to the second side 3b and the eighth side 6d in FIGS. 6A and 6B. The circuit pattern 7c has also been removed from the insulated circuit board 5.

(Variation 1-1)

Instead of the circuit patterns 4a and 4b in FIG. 1, a circuit pattern 4a1 is formed on the insulated circuit board 2 in FIG. 6A. The circuit pattern 4a1 has the same width as that of the circuit patterns 4a and 4b and is formed to extend near the first side 3a between the second side 3b and the fourth side 3d. In addition, a resistor chip 32 is formed on the circuit pattern 4a1 near the second side 3b. A lead frame 8a is directly connected to the front surface electrode of the resistor chip 32. In addition, the wires 9b1 and 9c1 directly connect the circuit pattern 4a1 and the control electrodes 30a of the corresponding semiconductor chips 30. That is, the rear surface electrode of the resistor chip 32 is electrically connected to the control electrodes 30a of the semiconductor chips 30.

This insulated circuit board 2 includes the resistor chip 32, the circuit pattern 4a1, and the wires 9b1 and 9cl between the lead frame 8a and the control electrodes 30a of the semiconductor chips 30. The insulated circuit board 2 according to variation 1-1 includes one less circuit pattern than the insulated circuit board 2 in FIG. 1. Thus, the insulated circuit board 2 according to variation 1-1 is formed more easily and needs a less manufacturing cost than the insulated circuit board 2 in FIG. 1. As is the case with the semiconductor device 1 in FIG. 1, this variation also reduces occurrence of an oscillation phenomenon and reduces deterioration of the reliability of the semiconductor device 1.

(Variation 1-2)

Instead of the vertical-type resistor chip 32 on the insulated circuit board 2 in FIG. 1, a horizontal-type resistor chip 32 (FIG. 2B) is formed to extend over the circuit patterns 4a and 4b on the insulated circuit board 2 in FIG. 6B. One end of the resistor chip 32 is directly connected to an end (in the direction of the fourth side 3d) of the circuit pattern 4a and the other end of the resistor chip 32 is directly connected to an end (in the direction of the second side 3b) of the circuit pattern 4b (see the lower part (sectional view) of FIG. 2B). That is, the electrode of the resistor chip 32 at the other end is electrically connected to the control electrodes 30a of the semiconductor chips 30, and the electrode of the resistor chip 32 at the one end is electrically connected to the lead frame 8a. As is the case with the semiconductor device 1 in FIG. 1, occurrence of an oscillation phenomenon is reduced, and deterioration of the reliability of the semiconductor device 1 is reduced.

Reference Example

Figure 7:
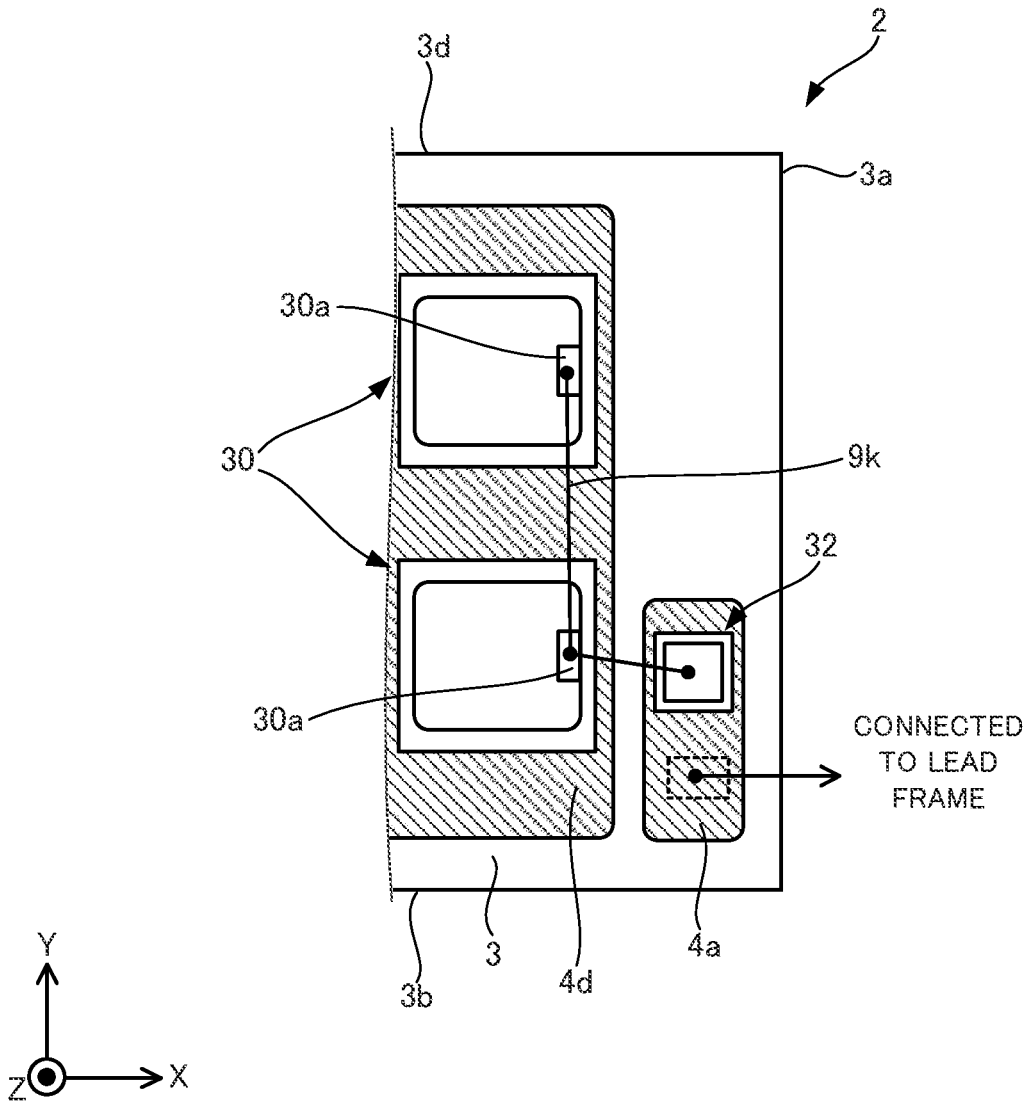
FIG. 7 is a plan view of a main part of a semiconductor device according to a reference example.

Next, a reference example in comparison to FIG. 1 and FIGS. 6A and 6B will be described with reference to FIG. 7. FIG. 7 is a plan view of a main part of a semiconductor device according to a reference example. An insulated circuit board 2 according to the reference example does not include the circuit patterns 4b and 4c, which are formed on the insulated circuit board 2 in FIG. 1. Thus, the front surface electrode of the resistor chip 32 and the control electrodes 30a of the semiconductor chips 30 are directly connected to each other via wires 9k by stitch bonding. However, in this case, the path from the resistor chip 32 to the control electrode 30a of one semiconductor chip 30 and the path from the resistor chip 32 to the control electrode 30a of the other semiconductor chip 30 have different wiring lengths. With these different wiring lengths, the path from the resistor chip 32 to one semiconductor chip 30 and the path from the resistor chip 32 to the other semiconductor chip 30 have different wiring resistances and inductances. Thus, occurrence of an oscillation phenomenon is not reduced as certainly as the cases in FIG. 1 and FIGS. 6A and 6B. Therefore, it is preferable that the resistor chip 32 be connected to the control electrodes 30a of the semiconductor chips 30 via at least one circuit pattern, instead of directly via wires.

Second Embodiment

Figure 8:
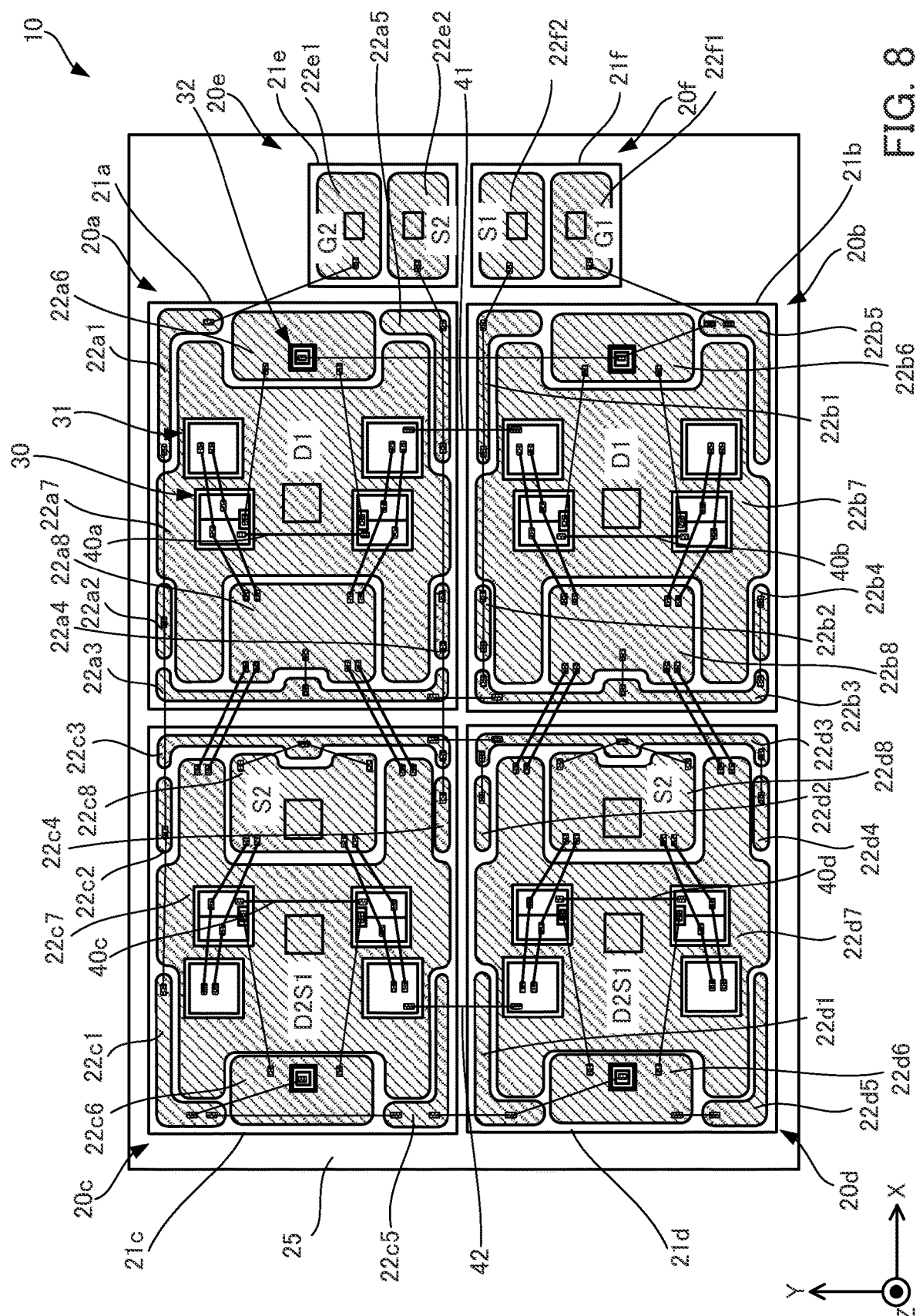
FIG. 8 is a plan view of a semiconductor device according to a second embodiment.

Next, a second embodiment will be described with reference to FIG. 8. FIG. 8 is a plan view of a semiconductor device according to a second embodiment. A semiconductor device 10 illustrated in FIG. 8 includes the same semiconductor chips 30 and 31 as those according to the first embodiment. However, the second embodiment assumes that the individual semiconductor chip 30 is a power MOS-FET. In addition, the wires other than wires 40a to 40d, 41, and 42 will be described as wires 40. Areas surrounded by squares in patterns in FIG. 8 represent portions to which lead frames are connected.

The semiconductor device 10 includes a base board 25 and insulated circuit boards 20a to 20d, the semiconductor chips 30 and 31, and the wires 40, 40a to 40d, 41, and 42 bonded to the front surface of the base board 25 via the above-described bonding material. These parts of the semiconductor device 10 may be stored in a case, and this case may be filled with sealing material. Alternatively, the insulated circuit boards 20a to 20d on the base board of the semiconductor device 10 may be filled with sealing material without using a case, and the rear surface of the base board may be exposed to the outside. The semiconductor device 10 is structured such that the insulated circuit boards 20a and 20b constitute an upper arm and the insulated circuit boards 20c and 20d constitute a lower arm.

The base board 25 is made of metal material having an excellent thermal conductivity as its main component.

Examples of the metal material include copper, aluminum, and an alloy containing at least one of these kinds. An individual metal plate has a thickness between 5.0 mm and 10.0 mm, inclusive. In plan view, the base board 25 has such an area that the insulated circuit boards 20*a* to 20*d* are arranged in a 2-by-2 matrix and that insulated circuit boards 20*e* and 20*f* are arranged between the right short side of the base board 25 and the insulated circuit boards 20*a* and 20*b*, as illustrated in FIG. 8. The surface of the base board 25 may be plated to improve its corrosion resistance. The material used for this plating is, for example, nickel, a nickel-phosphorus alloy, or a nickel-boron alloy.

The insulated circuit boards 20*a* to 20*f* include insulating plates 21*a* to 21*f*, circuit patterns 22*al* to 22*a*8, 22*b*1 to 22*b*8, 22*cl* to 22*c*8, 22*d*1 to 22*d*8, 22*e*1 and 22*e*2, and 22*f*1 and 22*f*2 formed on the front surfaces of the insulating plates 21*a* to 21*f*, and metal plates (not illustrated) formed on the rear surfaces of the insulating plates 21*a* to 21*f*. Corners of the insulating plates 21*a* to 21*f* and the metal plates may be R- or C-chamfered. The metal plates are smaller than their respective insulating plates 21*a* to 21*f* and formed inside their respective insulating plates 21*a* to 21*f* in plan view.

The insulating plates 21*a* to 21*f* are each made of ceramic material having a good thermal conductivity as its main component. For example, the ceramic material is made of material containing aluminum oxide, aluminum nitride, or silicon nitride as its main component. In addition, the insulating plates 21*a* to 21*f* each have a thickness between 0.2 mm and 2.5 mm, inclusive.

The individual metal plate is made of metal material having an excellent thermal conductivity as its main component. Examples of the metal material include copper, aluminum, and an alloy containing at least one of these kinds. In addition, the individual metal plate has a thickness between 0.1 mm and 5.0 mm, inclusive. The surface of the individual metal plate may be plated to improve its corrosion resistance. The material used for this plating is, for example, nickel, a nickel-phosphorus alloy, or a nickel-boron alloy.

The circuit patterns 22*a*1 to 22*a*8, 22*b*1 to 22*b*8, 22*cl* to 22*c*8, 22*d*1 to 22*d*8, 22*e*1 and 22*e*2, and 22*f*1 and 22*f*2 each have a rectangular shape of a different size in plan view. The circuit patterns 22*al* to 22*a*8, 22*b*1 to 22*b*8, 22*c*1 to 22*c*8, 22*d*1 to 22*d*8, 22*e*1 and 22*e*2, and 22*f*1 and 22*f*2 are each made of metal material having an excellent electrical conductivity as its main component. The metal material is, for example, copper, aluminum, or an alloy containing at least one of these kinds. In addition, the circuit patterns 22*a*1 to 22*a*8, 22*bl* to 22*b*8, 22*c*1 to 22*c*8, 22*d*1 to 22*d*8, 22*e*1 and 22*e*2, and 22*f*1 and 22*f*2 each have a thickness between 0.1 mm and 5.0 mm, inclusive. The surface of each of the circuit patterns 22*al* to 22*a*8, 22*b*1 to 22*b*8, 22*cl* to 22*c*8, 22*d*1 to 22*d*8, 22*e*1 and 22*e*2, and 22*f*1 and 22*f*2 may be plated to improve its corrosion resistance. The material used for this plating is, for example, nickel, a nickel-phosphorus alloy, or a nickel-boron alloy. The circuit patterns 22*a*1 to 22*a*8, 22*b*1 to 22*b*8, 22*c*1 to 22*c*8, 22*d*1 to 22*d*8, 22*e*1 and 22*e*2, and 22*f*1 and 22*f*2 are formed on their respective insulating plates 21*a* to 21*f* in the same way as described in the first embodiment.

The circuit patterns 22*a*6 and 22*b*6 are formed in the middle portions along the right short sides of their respective insulating plates 21*a* and 21*b* in FIG. 8. The circuit patterns 22*a*8 and 22*b*8 are formed in the middle portions along the left short sides of their respective insulating plates 21*a* and 21*b* in FIG. 8. The right side of each of the circuit patterns 22*a*7 and 22*b*7 in FIG. 8 surrounds about half of the outer periphery of the corresponding one of the circuit patterns

22*a*6 and 22*b*6, and each of the circuit patterns 22*a*7 and 22*b*7 extends in the left direction in FIG. 8. The left side of each of the circuit patterns 22*a*7 and 22*b*7 in FIG. 8 surrounds the outer periphery of the corresponding one of the circuit patterns 22*a*8 and 22*b*8 except for the left side of the corresponding one of the circuit patterns 22*a*8 and 22*b*8 in FIG. 8.

In addition, each of the circuit patterns 22*a*1, 22*a*5, 22*b*1, and 22*b*5 is formed in an L shape at a right-side corner of the corresponding one of the insulating plates 21*a* and 21*b*, as illustrated in FIG. 8. Each of the circuit patterns 22*a*2, 22*a*4, 22*b*2, and 22*b*4 is formed in a line along a peripheral edge of the corresponding one of the insulating plates 21*a* and 21*b* in parallel to the short sides of the circuit patterns 22*a*8 and 22*b*8 as illustrated in FIG. 8. Each of the circuit patterns 22*a*3 and 22*b*3 is formed in a U shape along the left side of the corresponding one of the insulating plates 21*a* and 21*b* in FIG. 8.

The circuit patterns 22*c*6 and 22*d*6 are formed in the middle portions along the left short sides of their respective insulating plates 21*c* and 21*d* in FIG. 8. The circuit patterns 22*c*8 and 22*d*8 are formed in the middle portions along the right short sides of their respective insulating plates 21*c* and 21*d* in FIG. 8. The left side of each of the circuit patterns 22*c*7 and 22*d*7 in FIG. 8 surrounds about half of the outer periphery of the corresponding one of the circuit patterns 22*c*6 and 22*d*6, and each of the circuit patterns 22*c*7 and 22*d*7 extends in the right direction in FIG. 8. The right side of each of the circuit patterns 22*c*7 and 22*d*7 in FIG. 8 surrounds the outer periphery of the corresponding one of the circuit patterns 22*c*8 and 22*d*8 except for the right side of the corresponding one of the circuit patterns 22*c*8 and 22*d*8 in FIG. 8.

In addition, each of the circuit patterns 22*c*1, 22*c*5, 22*d*1, and 22*d*5 is formed in an L shape at a left side corner of the corresponding one of the insulating plates 21*c* and 21*d*, as illustrated in FIG. 8. Each of the circuit patterns 22*c*2, 22*c*4, 22*d*2, and 22*d*4 is formed in a line along a peripheral edge of the corresponding one of the insulating plates 21*c* and 21*d* in parallel to the short sides of the circuit patterns 22*c*8 and 22*d*8, as illustrated in FIG. 8. Each of the circuit patterns 22*c*3 and 22*d*3 is formed in a U shape along the right side of the corresponding one of the insulating plates 21*c* and 21*d* in FIG. 8. The circuit patterns 22*e*1 and 22*e*2 are formed on the upper and lower portions on the front surface of the insulating plate 21*e* in plan view. The circuit patterns 22*f*1 and 22*f*2 are formed on the upper and lower portions on the front surface of the insulating plate 21*f* in plan view.

For example, DCB boards or AMB boards may be used as the insulated circuit boards 20*a* to 20*f* having the above structure. The insulated circuit boards 20*a* to 20*d* transfer the heat generated by the semiconductor chips 30 and 31 to the outside via the circuit patterns 22*a*7 and 22*b*7, 22*c*7, and 22*d*7, the insulating plates 21*a* to 21*d*, and the metal plates.

The semiconductor device 10 includes the same semiconductor chips 30 and 31 and resistor chips 32 as those described in the first embodiment. In FIG. 8, a vertical-type resistor chip is used as the individual resistor chip 32. The rear surface input electrodes of the semiconductor chips 30 are bonded to the circuit patterns 22*a*7, 22*b*7, 22*c*7, and 22*d*7 on the insulated circuit boards 20*a* to 20*d*. The rear surface negative electrodes of the semiconductor chips 31 are bonded to the circuit patterns 22*a*7, 22*b*7, 22*c*7, and 22*d*7 on the insulated circuit boards 20*a* to 20*d*. The rear surface electrodes of the resistor chips 32 are bonded to the circuit patterns 22*a*6, 22*b*6, 22*c*6, and 22*d*6 on the insulated circuit boards 20*a* to 20*d*.

Lead frames not illustrated are made of the same material as that according to the first embodiment. The lead frames are bonded to square areas illustrated on the insulated circuit boards 20a to 20f. That is, the lead frames, which correspond to terminals G2 and G1, are bonded to the circuit patterns 22e1 and 22f1 on the insulated circuit boards 20e and 20f, respectively. In addition, the lead frames, which correspond to terminals S2 and S1, are bonded to the circuit patterns 22e2 and 22f2 on the insulated circuit boards 20e and 20f, respectively. In addition, the lead frames, which correspond to a terminal D1, are bonded to the circuit patterns 22a7 and 22b7 on the insulated circuit boards 20a and 20b. The lead frames, which correspond to a terminal S2, are bonded to the circuit patterns 22c8 and 22d8 on the insulated circuit boards 20c and 20d. The lead frames, which correspond to a terminal D2S1, are bonded to the circuit patterns 22c7 and 22d7 on the insulated circuit boards 20c and 20d.

A control wire 40 directly connects the circuit patterns 22e1 and 22a1. Control wires 40 directly connect the circuit patterns 22a1, 22a2, 22c2, and 22c1. Another control wire 40 directly connects the circuit patterns 22c1 and 22c6 and the resistor chip 32. Another control wire 40 directly connects the circuit pattern 22c6 and the control electrode 30a of one semiconductor chip 30 on the insulated circuit board 20c. Other control wires 40 directly connect the circuit patterns 22c1, 22c5, and 22d1 and the resistor chip 32.

In addition, another control wire 40 directly connects the circuit patterns 22f1 and 22b5. Another control wire 40 directly connects the circuit pattern 22b5 and a resistor chip 32. Another control wire 40 directly connects the circuit pattern 22b6 and the control electrode 30a of one semiconductor chip 30 on the insulated circuit board 20b. In addition, another control wire 40 directly connects the resistor chip 32 on the insulated circuit board 20b and the resistor chip 32 on the insulated circuit board 20a. Another control wire 40 directly connects the circuit pattern 22b6 and the control electrode 30a of the other semiconductor chip 30 on the insulated circuit board 20b. These control wires 40 each have a diameter, for example, between 25 μm and 400 μm, inclusive.

Main current wires 40 directly connect the output electrodes 30b of the semiconductor chips 30, the front surface positive electrodes of the semiconductor chips 31, and the circuit pattern 22a8 on the insulated circuit board 20a. Other main current wires 40 directly connect the circuit patterns 22a8 and 22c7. Other main current wires 40 directly connect the output electrodes 30b of the semiconductor chips 30, the front surface positive electrodes of the semiconductor chips 31, and the circuit pattern 22c8 on the insulated circuit board 20c.

Other main current wires 40 directly connect the output electrodes 30b of the semiconductor chips 30, the front surface positive electrodes of the semiconductor chips 31, and the circuit pattern 22b8 on the insulated circuit board 20b. Other main current wires 40 directly connect the circuit patterns 22b8 and 22d7. Other main current wires 40 directly connect the output electrodes 30b of the semiconductor chips 30, the front surface positive electrodes of the semiconductor chips 31, and the circuit pattern 22d8 on the insulated circuit board 20d. The main current wires 40 each have a diameter between 100 μm and 600 μm, inclusive.

Detection wires 40 directly connect the circuit patterns 22f2, 22b1, 22b2, 22b3, 22b4, and 22b8. Other detection wires 40 directly connect the circuit patterns 22b3, 22a3, and 22a8. In addition, other detection wires 40 directly connect the circuit patterns 22e2, 22a5, 22a4, 22c3, and 22c4. Other detection wires 40 directly connect the circuit patterns 22c3 and 22c8. Other detection wires 40 directly connect the circuit patterns 22c3, 22d3, 22d8, and 22d4. These detection wires 40 each have a diameter, for example, between 25 μm and 400 μm, inclusive. These detection wires 40 may have the same diameter as that of the control wires 40.

In addition, on the insulated circuit boards 20a to 20d, the wires 40a to 40d directly connect the output electrode 30b of their respective semiconductor chips 30. The wire 41 directly connects the front surface positive electrode of one semiconductor chip 31 on the insulated circuit board 20a and the front surface positive electrode of one semiconductor chip 31 on the insulated circuit board 20b. The wire 42 directly connects the front surface positive electrode of one semiconductor chip 31 on the insulated circuit board 20c and the front surface positive electrode of one semiconductor chip 31 on the insulated circuit board 20d. These wires 40a to 40d, 41, and 42 each have a diameter, for example, between 25 μm and 400 μm, inclusive. In addition, each of the wires 40a to 40d, 41, and 42 may be one or more wires. These wires 40a to 40d, 41, and 42 may each have the same diameter as that of the control wires 40.

Figure 9:
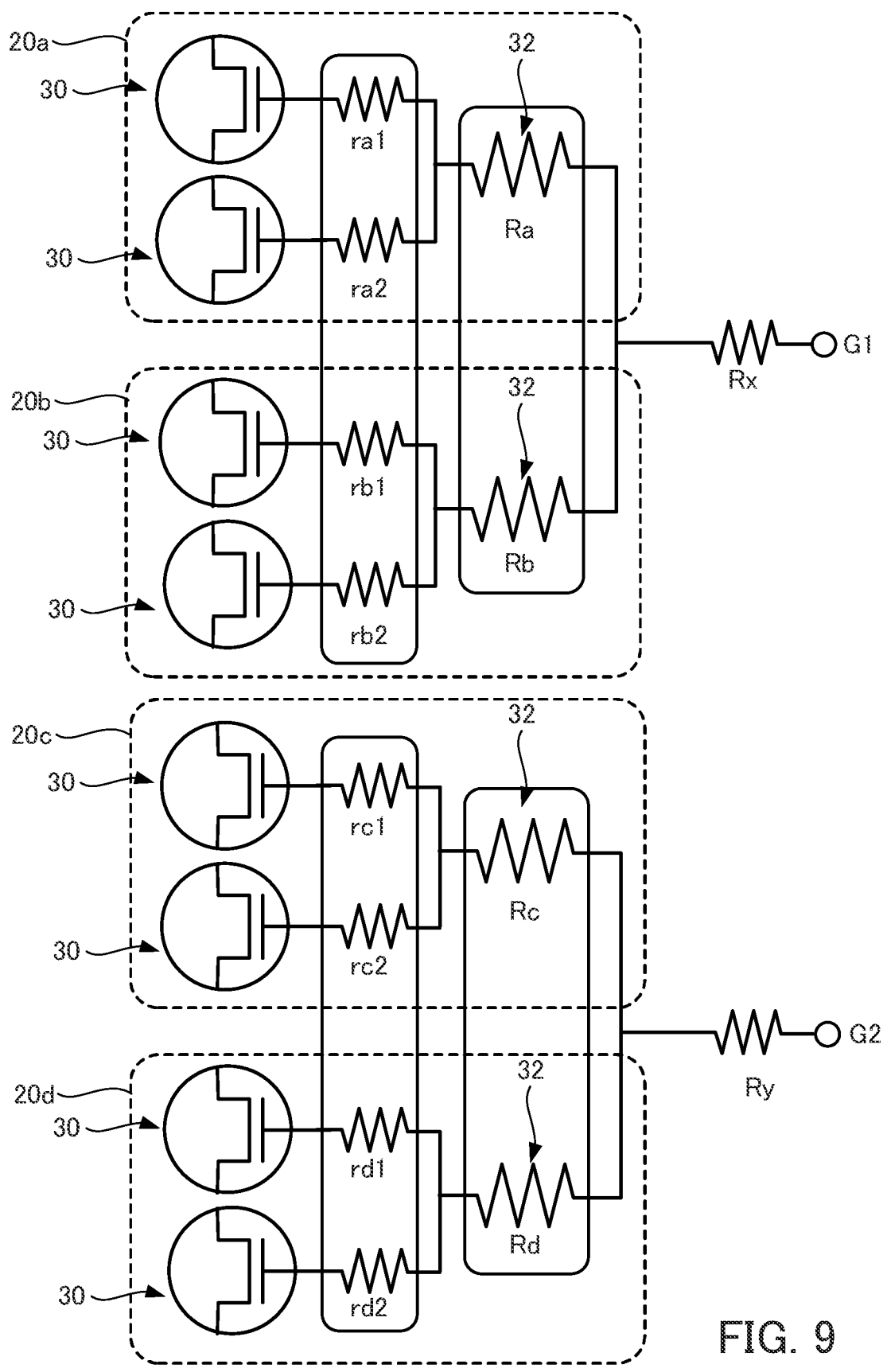
FIG. 9 illustrates a control-side wiring structure of the semiconductor device according to the second embodiment.

Next, a wiring structure from the lead frames corresponding to the terminals G1 and G2 of the semiconductor device 10 to the control electrodes 30a of the semiconductor chips 30 on the insulated circuit boards 20a to 20d will be described with reference to FIG. 9. FIG. 9 illustrates a control-side wiring structure of the semiconductor device according to the second embodiment.

In FIG. 9, resistors Rx and Ry represent resistances (wiring resistances) when a current flows from the lead frames corresponding to the terminals G1 and G2 to the circuit patterns 22f1 and 22e1. That is, the resistors Rx and Ry represent the resistances of the lead frames corresponding to the terminals G1 and G2. A resistor Ra is a sum of wiring resistances of the circuit pattern 22f1, wire 40, circuit pattern 22b5, and wire 40 on the insulated circuit board 20f and the resistance of the resistor chip 32 on the insulated circuit board 20b. A resistor Rb represents a sum of wiring resistances of the circuit pattern 22f1, wire 40, circuit pattern 22b5 on the insulated circuit board 20f, and wires 40 (connecting the circuit patterns 22b5, 22b6, and 22a6) and the resistance of the resistor chip 32 on the insulated circuit board 20a.

A resistor Rc represents a sum of wiring resistances of the circuit pattern 22e1, wire 40, circuit pattern 22a1, wire 40, circuit pattern 22a2, wire 40, circuit pattern 22c2, wire 40, circuit pattern 22c1, and wire 40 and the resistance of the resistor chip 32 on the insulated circuit board 20c. A resistor Rd represents a sum of wiring resistances of the circuit pattern 22e1, wire 40, circuit pattern 22a1, wire 40, circuit pattern 22a2, wire 40, circuit pattern 22c2, wire 40, circuit pattern 22c1, wire 40, circuit pattern 22c5, wire 40, circuit pattern 22d1, and wire 40 and the resistance of the resistor chip 32 on the insulated circuit board 20d.

Resistors ra1 and ra2 each represent the wiring resistance from the circuit pattern 22a6 to the control electrode 30a of a semiconductor chip 30 on the insulated circuit board 20a. That is, the resistors ra1 and ra2 each represent the wiring resistance of a wire 40. The resistors rb1 and rb2 each represent the wiring resistance from the circuit pattern 22b6 to the control electrode 30a of a semiconductor chip 30 on the insulated circuit board 20b. That is, the resistors rb1 and rb2 each represent the wiring resistance of a wire 40.

Resistors rc1 and rc2 each represent the wiring resistance from the circuit pattern 22c6 to the control electrode 30a of a semiconductor chip 30 on the insulated circuit board 20c.

That is, the resistors rc1 and rc2 each represent the wiring resistance of a wire 40. Resistors rd1 and rd2 each represent the wiring resistance from the circuit pattern 22d6 to the control electrode 30a of a semiconductor chip 30 on the insulated circuit board 20d. That is, the resistors rc1 and rc2 each represent the wiring resistance of a wire 40.

In addition, each of the resistances Ra to Rd of the resistor chip 32 formed on the insulated circuit boards 20a to 20d is greater than any one of the resistances Rx and Ry from the individual lead frames to the resistor chips 32 and greater than any one of the resistances ra1, ra2, rb1, rb2, rc1, rc2, rd1, and rd2. Specific resistance values are the same as those according to the first embodiment.

Thus, as in the first embodiment, use of the resistor chips 32 reduces the relative difference in the wiring resistance and inductance from the terminals G1 and G2. When a control voltage to the lead frames corresponding to the terminals G1 and G2 is set on (or off), the difference in the rise time (or fall time) among the plurality of semiconductor chips 30 is reduced. In this way, the voltages at the output electrodes 30b (source electrodes) are not disturbed. Thus, a stable voltage is outputted to an external control device. Thus, assuming that the potentials at the output electrodes 30b of the semiconductor chips 30 on the different insulated circuit boards 20a to 20d are equalized, by disposing the resistor chips 32, occurrence of an oscillation phenomenon and a malfunction caused thereby is reduced.

Figure 10:
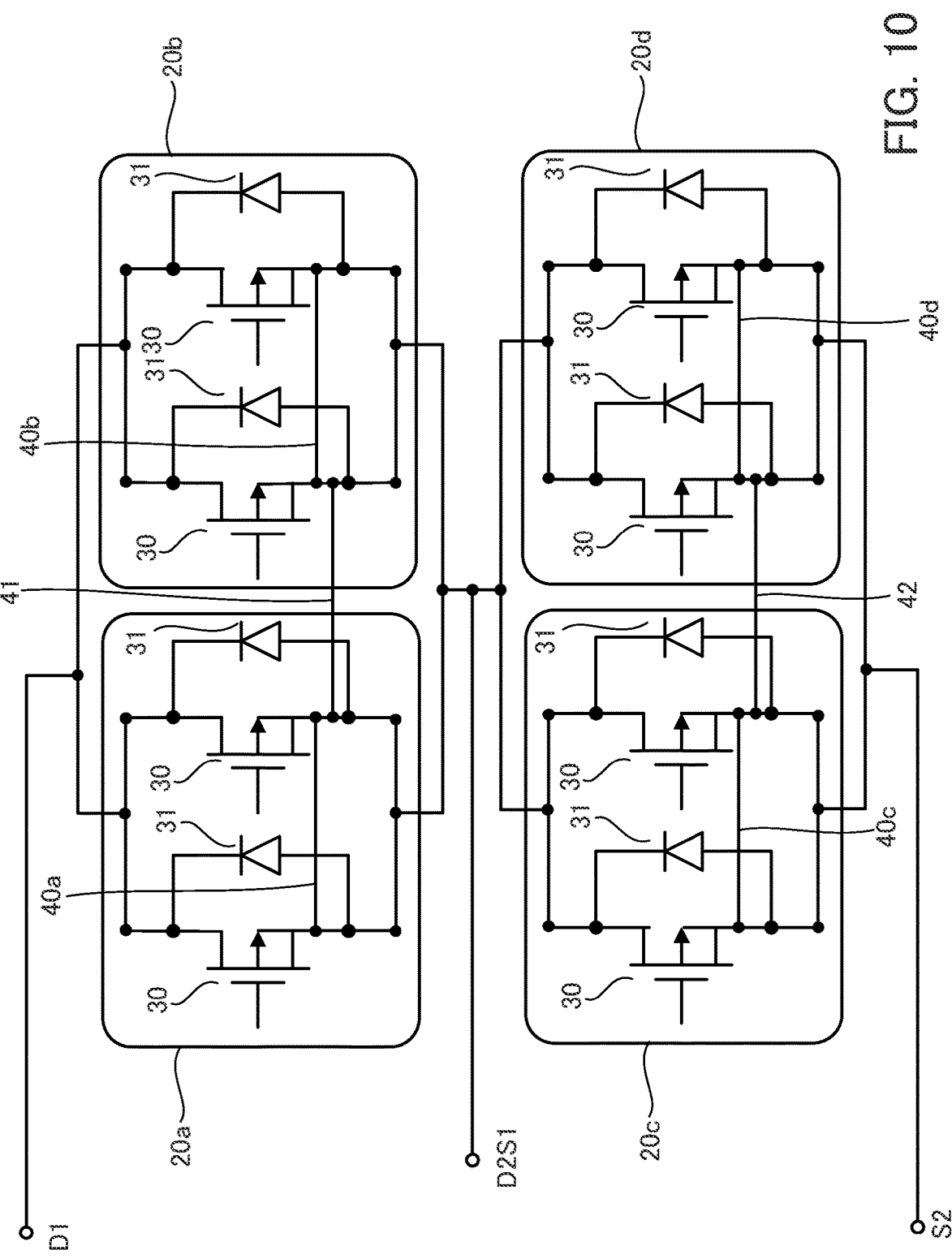
FIG. 10 illustrates an equivalent circuit of the semiconductor device according to the second embodiment.

Next, an equivalent circuit of the semiconductor device 10 will be described with reference to FIG. 10 and FIG. 8. FIG. 10 illustrates an equivalent circuit of the semiconductor device according to the second embodiment. FIG. 10 illustrates a case in which a power MOSFET is used as the individual semiconductor chip 30 as described above. In addition, FIG. 10 corresponds to the insulated circuit boards 20a to 20d. FIG. 10 illustrates a control-side wiring structure as in FIG. 3. The output side of the semiconductor device 10 according to the second embodiment has the same wiring structure as in FIG. 4.

The rear surface input electrodes (drain electrodes) of the semiconductor chips 30 and the rear surface negative electrodes of the semiconductor chips 31 are electrically connected to the lead frames corresponding to the terminal D1 via the circuit patterns 22a7 and 22b7 on the insulated circuit boards 20a and 20b.

The front surface output electrodes 30b (source electrodes) of the semiconductor chips 30 on the insulated circuit boards 20a and 20b and the front surface positive electrodes of the semiconductor chips 31 are electrically connected to the lead frames corresponding to the terminal D2S1 via the wires 40 and the circuit patterns 22a8, 22b8, 22c8, 22d8, 22c7, and 22d7.

The rear surface input electrodes (drain electrodes) of the semiconductor chips 30 and the rear surface negative electrodes of the semiconductor chips 31 are electrically connected to the lead frames corresponding to the terminal D2S1 via the circuit patterns 22c7 and 22d7 on the insulated circuit boards 20c and 20d.

The front surface output electrodes 30b (source electrodes) of the semiconductor chips 30 and the front surface positive electrodes of the semiconductor chips 31 on the insulated circuit boards 20c and 20d are electrically connected to the lead frames corresponding to the terminal S2 via the wires 40 and the circuit patterns 22c8 and 22d8.

In addition, the front surface positive electrode of one semiconductor chip 31 on the insulated circuit board 20a and the front surface positive electrode of one semiconductor chip 31 on the insulated circuit board 20b are directly connected to each other via the wire 41. The front surface positive electrode of one semiconductor chip 31 on the insulated circuit board 20c and the front surface positive electrode of one semiconductor chip 31 on the insulated circuit board 20d are directly connected to each other via the wire 42. In this way, as described with reference to FIG. 9, when the variation in the wiring resistance and inductance among the control electrodes 30a of the semiconductor chips 30 is small, the potentials of the front surface positive electrodes are equalized. As a result, a stable voltage is outputted from the output electrodes 30b (source electrodes) to an external control device.

In addition, the output electrodes 30b of the semiconductor chips 30 on the insulated circuit board 20a are directly connected to each other via the wire 40a. On the insulated circuit boards 20b to 20d, too, the output electrodes 30b of the semiconductor chips 30 are directly connected to each other via the wires 40b to 40d. In this way, the potentials of the output electrodes 30b of the semiconductor chips 30 on their respective insulated circuit boards 20a to 20d are equalized, and increase in the inductance value is suppressed.

Thus, the semiconductor device 10 includes the resistor chips 32, and the front surface positive electrodes of semiconductor chips 31 formed on the different insulated circuit boards 20a and 20b are directly connected to each other via the wire 41. Likewise, the front surface positive electrodes of semiconductor chips 31 formed on the different insulated circuit boards 20c and 20d are directly connected to each other via the wire 42. In addition, on each of the insulated circuit boards 20a to 20d, the output electrodes 30b of the semiconductor chips 30 are directly connected to each other via a wire 40. In this way, an oscillation phenomenon of the semiconductor chips 30 of the semiconductor device 10 is reduced, and deterioration of the reliability is reduced.

The present technique achieves reduction of occurrence of an oscillation phenomenon and reduction of deterioration of the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   first and second insulating plates;
   a plurality of first semiconductor chips, each of which includes a first control electrode and a first output electrode on a front surface thereof and a first input electrode on a rear surface thereof;
   a plurality of second semiconductor chips, each of which includes a second control electrode and a second output electrode on a front surface thereof and a second input electrode on a rear surface thereof;
   a first input circuit pattern on which the first input electrodes of the plurality of first semiconductor chips are disposed;
   a first control circuit pattern electrically connected to the first control electrodes;

a second input circuit pattern on which the second input electrodes of the plurality of second semiconductor chips are disposed;

a second control circuit pattern electrically connected to the second control electrodes;

a first resistive element and a first resistive circuit pattern having the first resistive element thereon, the first control electrodes and the first resistive element being electrically connected via the first control circuit pattern;

a second resistive element and a second resistive circuit pattern having the second resistive element thereon, the second control electrodes and the second resistive element being electrically connected via the second control circuit pattern; and a first inter-board wiring member, at least one of the first output electrodes and at least one of the second output electrodes being electrically connected to each other via the first inter-board wiring member, wherein the first input circuit pattern, the first control circuit pattern and the first resistive circuit pattern are disposed on the first insulating plate, with the first input circuit pattern and the first resistive circuit pattern being spaced apart from each other, the second input circuit pattern, the second control circuit pattern, and the second resistive circuit pattern are disposed on the second insulating plate, with the second input circuit pattern and the second resistive circuit pattern being spaced apart from each other, the first insulating plate has a rectangular shape in a plan view of the semiconductor device and has a first side, a second side, a third side, and a fourth side in this order around the first insulating plate, the first control circuit pattern is formed on the front surface of the first insulating plate, closer to the first side than to the third side, the first resistive circuit pattern is formed closer to the first side than to the third side of the first insulating plate and closer than the first control circuit pattern to the second side, the second insulating plate has a rectangular shape in the plan view and has a fifth side, a sixth side, a seventh side, and an eighth side in this order around the second insulating plate, the second control circuit pattern is formed on the front surface of the second insulating plate, closer to the fifth side than to the seventh side, and the second resistive circuit pattern is formed on the second insulating plate, closer to the fifth side than to the seventh side and closer than the second control circuit pattern to the eighth side.

2. The semiconductor device according to claim 1, further comprising a plurality of first control wiring members and a plurality of second control wiring members, wherein the first control electrode of each of the plurality of first semiconductor chips is directly connected to the first control circuit pattern via a respective one of the plurality of first control wiring members, and wherein the second control electrode of each of the plurality of second semiconductor chips is directly connected to the second control circuit pattern via a respective one of the plurality of second control wiring members.

3. The semiconductor device according to claim 1, wherein at least one of the first output electrodes and at least one of the second output electrodes are directly connected to each other via the first inter-board wiring member.

4. The semiconductor device according to claim 3, further comprising a first intra-board output wiring member and a second intra-board output wiring member, wherein the first output electrodes of the plurality of first semiconductor chips are directly connected to each other via the first intra-board output wiring member, and wherein the second output electrodes of the plurality of second semiconductor chips are directly connected to each other via the second intra-board output wiring member.

5. The semiconductor device according to claim 1, further comprising:

a first insulated circuit board including the first insulating plate; and a second insulated circuit board including the second insulating plate, wherein the first input circuit pattern and the first control circuit pattern are disposed on a front surface of the first insulating plate, and wherein the second input circuit pattern and the second control circuit pattern are disposed on a front surface of the second insulating plate.

6. The semiconductor device according to claim 5, wherein the first input circuit pattern is formed on the front surface of the first insulating plate, closer to the third side than is the first control circuit pattern, wherein the second input circuit pattern is formed on the front surface of the second insulating plate, closer to the seventh side than is the second control circuit pattern, and wherein the second insulated circuit board is adjacent to the first insulated circuit board such that on a same plane in the plan view, the fifth side and the first side are aligned and the seventh side and the third side are aligned.

7. The semiconductor device according to claim 6, wherein the first resistive element includes a first front surface electrode on a front surface thereof and a first rear surface electrode on a rear surface thereof, wherein the second resistive element includes a second front surface electrode on a front surface thereof and a second rear surface electrode on a rear surface thereof, wherein the first rear surface electrode of the first resistive element is bonded via bonding material to the first resistive circuit pattern, the first control electrodes being electrically connected to the first resistive circuit pattern, and wherein the second rear surface electrode of the second resistive element is bonded via bonding material to the second resistive circuit pattern, the second control electrodes being electrically connected to the second resistive circuit pattern, the semiconductor device further comprising:

a first relay control wiring member, the first front surface electrode of the first resistive element being directly connected to the first control circuit pattern via the first relay control wiring member; and a second relay control wiring member, the second front surface electrode of the second resistive element being directly connected to the second control circuit pattern via the second relay control wiring member.

8. The semiconductor device according to claim 6, wherein the first resistive element includes a first electrode on each of two opposite sides thereof, wherein the second resistive element includes a second electrode on each of two opposite sides thereof, wherein the first electrode of the first resistive element is bonded via bonding material to the first resistive circuit pattern, the first control electrodes being electrically connected to the first resistive circuit pattern, wherein the second electrode of the second resistive element is bonded via bonding material to the second resistive circuit pattern, the second control electrodes being electrically connected to the second resistive circuit pattern, wherein the first electrode of the first resistive element is bonded to the first control circuit pattern via bonding material, and wherein the second electrode of the second resistive element is bonded to the second control circuit pattern via bonding material.

9. The semiconductor device according to claim 1, further comprising:

a plurality of third semiconductor chips, each of which includes a first positive electrode on a front surface thereof and a first negative electrode on a rear surface thereof, the first negative electrode being disposed on the first input circuit pattern;

a plurality of fourth semiconductor chips, each of which includes a second positive electrode on a front surface thereof and a second negative electrode on a rear surface thereof, the second negative electrode being disposed on the second input circuit pattern; and a second inter-board wiring member, wherein at least one of the first positive electrodes and at least one of the second positive electrodes are directly connected to each other via the second inter-board wiring member.

10. The semiconductor device according to claim 1, wherein the first resistive element includes a first front surface electrode on a front surface thereof and a first rear surface electrode on a rear surface thereof, wherein the second resistive element includes a second front surface electrode on a front surface thereof and a second rear surface electrode on a rear surface thereof, wherein the first rear surface electrode of the first resistive element is bonded to the first control circuit pattern via bonding material, wherein the second rear surface electrode of the second resistive element is bonded to the second control circuit pattern via bonding material, wherein the first rear surface electrode of the first resistive element is electrically connected to the first control electrodes, and wherein the second rear surface electrode of the second resistive element is electrically connected to the second control electrodes.

11. The semiconductor device according to claim 1, wherein the plurality of first semiconductor chips and the plurality of second semiconductor chips are made of wide bandgap semiconductor.

12. The semiconductor device according to claim 11, wherein the wide bandgap semiconductor is silicon carbide.

13. The semiconductor device according to claim 1, wherein the first insulating plate and the second insulating plate are adjacent across a boundary line, and each of the following pairs is symmetrically disposed on opposite sides of the boundary line:

the first and second control circuit patterns;

the first and second input circuit patterns;

the first and second resistive circuit patterns; and the first and second resistive elements.

*    *    *    *    *